United States Patent
Ozaki et al.

(10) Patent No.: US 9,587,877 B2
(45) Date of Patent: Mar. 7, 2017

(54) ORGANIC ELECTROLUMINESCENT DEVICE HAVING A PHOTOCATALYST LAYER

(71) Applicant: Nitto Denko Corporation, Osaka (JP)

(72) Inventors: Takashi Ozaki, Osaka (JP); Haruka Ona, Osaka (JP); Hideki Hayama, Osaka (JP); Naoki Ban, Osaka (JP); Akiko Mimoto, Osaka (JP); Takuya Fukumura, Osaka (JP); Ekambaram Sambandan, Oceanside, CA (US); Rajesh Mukherjee, Oceanside, CA (US)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/903,730

(22) PCT Filed: Jul. 8, 2014

(86) PCT No.: PCT/JP2014/068196
§ 371 (c)(1),
(2) Date: Jan. 8, 2016

(87) PCT Pub. No.: WO2015/005346
PCT Pub. Date: Jan. 15, 2015

(65) Prior Publication Data
US 2016/0161178 A1  Jun. 9, 2016

(30) Foreign Application Priority Data

Jul. 9, 2013 (JP) .................. 2013-143584

(51) Int. Cl.
*H01L 51/50* (2006.01)
*F25D 29/00* (2006.01)
(Continued)

(52) U.S. Cl.
CPC .............. *F25D 29/00* (2013.01); *B01J 23/10* (2013.01); *B01J 23/14* (2013.01); *B01J 23/72* (2013.01);
(Continued)

(58) Field of Classification Search
CPC ... H01L 51/50; H01L 51/5012; H01L 51/504; H01L 51/5253; H01L 31/12; H01L 31/125; H01L 2251/303; H01L 2251/5315
See application file for complete search history.

(56) References Cited

U.S. PATENT DOCUMENTS

2004/0263441 A1\* 12/2004 Tanaka .................. G09G 3/325
345/76

FOREIGN PATENT DOCUMENTS

JP   2006-269819      10/2006
JP   2011-110542 A     6/2011
(Continued)

OTHER PUBLICATIONS

International Search Report of PCT/JP2014/068196 filed on Jul. 8, 2014, mailing date of ISR Nov. 8, 2014.

*Primary Examiner* — Hoai V Pham
(74) *Attorney, Agent, or Firm* — K&L Gates LLP; Brent A. Johnson; Louis C. Cullman

(57) ABSTRACT

The present invention relates to an organic electroluminescent device comprising a substrate, an organic electroluminescent element, and a photocatalyst layer, wherein the organic electroluminescent element includes: a first conductive layer provided on the substrate; an organic electroluminescent layer provided on the first conductive layer; and a second conductive layer provided on the organic electroluminescent layer, wherein the photocatalyst layer covers all or part of a light-emitting region of the organic electroluminescent element, and contains a photocatalyst and a (Continued)

co-catalyst, and wherein an absolute value of the difference (|R1−R2|) between the refractive index (R1) of the photocatalyst and the refractive index (R2) of the co-catalyst at a wavelength of 589 nm is 0 to 0.35.

9 Claims, 4 Drawing Sheets

(51) Int. Cl.
    *F25D 17/04*     (2006.01)
    *H01L 51/52*     (2006.01)
    *B01J 35/00*     (2006.01)
    *B01J 23/10*     (2006.01)
    *B01J 23/14*     (2006.01)
    *B01J 23/72*     (2006.01)

(52) U.S. Cl.
    CPC .......... *B01J 35/004* (2013.01); *F25D 17/042* (2013.01); *H01L 51/5012* (2013.01); *H01L 51/5253* (2013.01); *H01L 2251/303* (2013.01); *H01L 2251/5315* (2013.01)

(56) References Cited

FOREIGN PATENT DOCUMENTS

| | | |
|---|---|---|
| JP | 2012-160372 A | 8/2012 |
| JP | 2012-86104 A | 10/2012 |
| JP | 2013-103202 A | 5/2013 |
| WO | 2012-132716 A1 | 10/2012 |

\* cited by examiner

ORGANIC ELECTROLUMINESCENT DEVICE HAVING A PHOTOCATALYST LAYER

TECHNICAL FIELD

The present invention relates to an organic electroluminescent device having a photocatalyst layer and so on.

BACKGROUND ART

Organic electroluminescent devices are typically structured to include an organic electroluminescent element laminated on a substrate. The organic electroluminescent element includes at least a first conductive layer, an organic electroluminescent layer, and a second conductive layer. There have been studies to use such organic electroluminescent devices in applications such as in lighting devices. In the following, "organic electroluminescent" will be referred to simply as "organic EL."

On the other hand, it is known that organic environmental pollutants (organic contaminants) in air and water are decomposable with a photocatalyst. A photocatalyst is a substance that shows catalytic effects upon being irradiated with light of a specific wavelength range. Specifically, a photocatalyst generates conductive electrons and holes in response to excitation (photoexcitation) of electrons in the valence band upon being irradiated with light of a specific wavelength range (excitation light having a higher energy than the band gap between the valence band and the conduction band of the photocatalyst). The photocatalyst can thus function as a catalyst that accelerates a variety of chemical reactions with the reducing power of the electrons generated in the conduction band, and the oxidizing power of the holes generated in the valance band as a result of photoexcitation.

Once activated and brought to the state that can exhibit the catalytic function in response to irradiation of excitation light, a photocatalyst can use its strong oxidizing power to decompose organic contaminants contained in air and water that are in contact with the photocatalyst.

There have been attempts to combine an organic EL element and a photocatalyst, and decompose organic contaminants in air for deodorization and sterilization purposes. Specifically, it is known to laminate a photocatalyst-containing photocatalyst layer on an organic EL element, activate the photocatalyst layer with the excitation light produced by emission of the organic EL element, and decompose organic contaminants through redox reaction (for example, PTL 1).

However, a photocatalyst layer typically has poor translucency. A problem of laminating a photocatalyst-containing photocatalyst layer on an organic EL element, then, is that the light from the organic EL element cannot easily pass through the photocatalyst layer, making it difficult to use the organic EL device with the photocatalyst layer for illumination applications.

One possible solution is to make the photocatalyst layer more translucent by reducing the thickness of the photocatalyst layer. A problem, however, is that reducing the thickness of the photocatalyst layer lowers the oxidizing and reducing power of the photocatalyst layer, and the photocatalyst fails to sufficiently decompose organic contaminants in air.

An ultraviolet responsive photocatalyst is a well known example of photocatalysts. Because of its large band gap, an ultraviolet responsive photocatalyst hardly shows activity unless irradiated with high energy ultraviolet light of short wavelengths (wavelengths of less than 380 nm). An organic EL element using an ultraviolet responsive photocatalyst as the photocatalyst in its photocatalyst layer thus requires emitting primarily ultraviolet light. However, ultraviolet light is not visible, and is harmful to human body and food. It is accordingly difficult to use an organic EL device with such a photocatalyst layer for lighting applications in rooms or refrigerators.

One way to overcome this problem is to form a photocatalyst layer with a photocatalyst (visible-light responsive photocatalyst) that can be activated with visible light (wavelengths of 380 nm to 780 nm) having smaller energy. However, the photocatalytic activity of a visible-light responsive photocatalyst is typically low (the oxidizing and reducing power is weak). A problem thus still remains that use of a conventional visible-light responsive photocatalyst for a photocatalyst layer is not sufficient to decompose organic contaminants.

CITATION LIST

Patent Literature

Patent Literature 1: JP-A-2006-269819

SUMMARY OF INVENTION

Technical Problem

A first object of the present invention is to provide an organic EL device having a photocatalyst layer that has translucency sufficient for illumination applications. A second object of the present invention is to provide an organic EL device having a photocatalyst layer that has translucency sufficient for illumination applications, and that shows high photocatalytic activity with visible light.

Solution to Problem

The present inventors conducted intensive studies to find the cause of the poor translucency of a photocatalyst layer containing a visible-light responsive photocatalyst, and found that the large refractive index difference between the visible-light responsive photocatalyst and a co-catalyst in the photocatalyst layer was partly responsible for the poor translucency of a photocatalyst layer.

Specifically, a visible-light responsive photocatalyst typically has poor photocatalytic activity by itself. A co-catalyst that promotes the photocatalytic activity of the visible-light responsive photocatalyst is thus typically added to a photocatalyst layer containing the visible-light responsive photocatalyst. However, the light emitted by the organic EL element becomes more likely to be refracted inside the photocatalyst layer, and remain in the photocatalyst layer for extended time periods as the refractive index difference between the visible-light responsive photocatalyst and the co-catalyst increases. The result is that the light is less likely to emerge from the photocatalyst layer, and the luminance of the organic EL device decreases.

On the basis of this finding, the present inventors found that a photocatalyst layer having high translucency can be formed, and an organic EL device having high luminance can be obtained by reducing the refractive index difference between the visible-light responsive photocatalyst and the co-catalyst.

An organic electroluminescent device of the present invention comprises a substrate, an organic electroluminescent element, and a photocatalyst layer, wherein the organic electroluminescent element includes: a first conductive layer provided on the substrate; an organic electroluminescent layer provided on the first conductive layer; and a second conductive layer provided on the organic electroluminescent layer, wherein the photocatalyst layer covers all or part of a light-emitting region of the organic electroluminescent element, and contains a photocatalyst and a co-catalyst, and wherein an absolute value of the difference (|R1−R2|) between the refractive index (R1) of the photocatalyst and the refractive index (R2) of the co-catalyst at a wavelength of 589 nm is 0 to 0.35.

In an organic electroluminescent device according to one preferable embodiment of the present invention, the photocatalyst layer shows photocatalytic activity with visible light.

In an organic electroluminescent device according to one preferable embodiment of the present invention, the photocatalyst contains tungsten oxide, and the co-catalyst contains cerium oxide. More preferably, the tungsten oxide is tungsten(VI) oxide, and the cerium oxide is cerium(IV) oxide. Moreover, furthermore preferably, the cerium oxide is a doped-type co-catalyst doped with tin (Sn) within the molecule.

In an organic electroluminescent device according to one preferable embodiment of the present invention, the photocatalyst contains titanium(IV) oxide, and wherein the co-catalyst contains copper(I) oxide and/or copper(II) oxide, and is supported on the photocatalyst.

In an organic electroluminescent device according to one preferable embodiment, the photocatalyst layer is provided on the organic electroluminescent element, and wherein the organic electroluminescent element is top-emission type.

In an organic electroluminescent device according to one preferable embodiment of the present invention, the organic electroluminescent element further includes a translucent insulating layer on the second conductive layer, and the photocatalyst layer is provided on the insulating layer.

Furthermore, in another aspect, the present invention provides a refrigerator comprising the organic electroluminescent device of any one of the above.

Advantageous Effects of Invention

The organic EL device of the present invention has a sufficiently small refractive index difference between the visible-light responsive photocatalyst and the co-catalyst contained in the photocatalyst layer (the photocatalyst layer is sufficiently translucent). The invention can thus provide an organic EL device having a photocatalytic function and high luminance.

DESCRIPTION OF EMBODIMENTS

The present invention is described below with reference to the accompanying drawings. It should be noted that the thicknesses, lengths, and other dimensions in the figures are not to scale relative to actual size. As used herein, ordinals such as "first" and "second" affixed to terms are used solely to distinguish terms, and do not convey any special meaning, including order, and superiority and inferiority.

Figure 2:
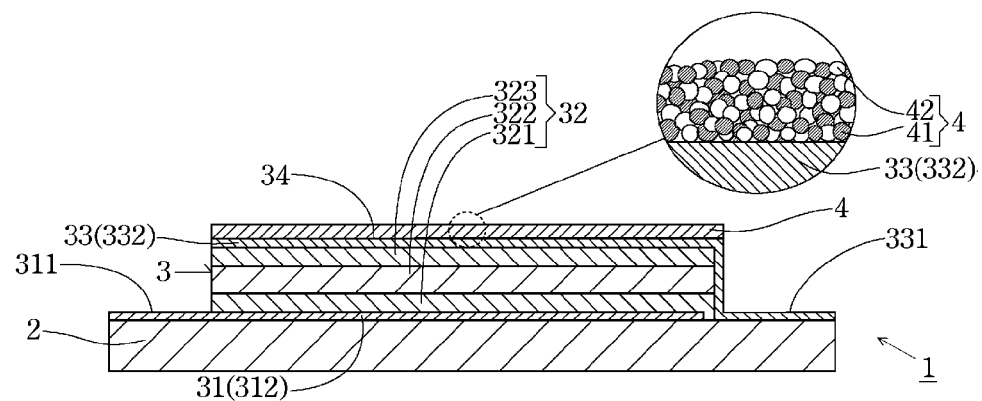
FIG. 2 represents an enlarged cross sectional view of the organic EL device of FIG. 1 taken at line II-II, and a partial magnified view shown for reference.

As used herein, for convenience, the term "on" used in the context of direction is intended to mean the upper side of the figure relative to an organic EL device placed on a horizontal surface, such as shown in FIG. 2. Likewise, the term "under" means the lower side of the figure. The surface of a member or a portion will be referred to as "top surface" when it is on the upper side, and "back surface" when it is on the lower side of the figure.

Figure 1:
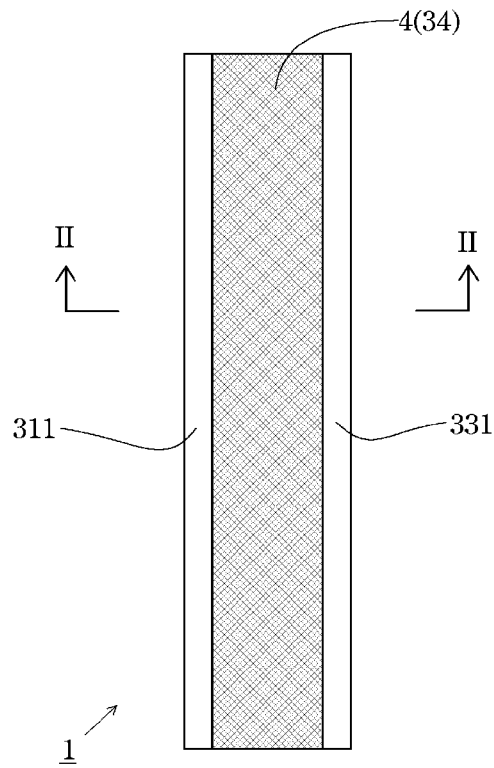
FIG. 1 is a plan view representing an organic EL device according to an embodiment of the present invention.

FIG. 1 is a plan view representing an organic EL device 1 according to an embodiment of the present invention. FIG. 2 is an enlarged cross sectional view of the organic EL device 1.

In the present embodiment, the organic EL device 1 is substantially strip-like in shape in planar view. However, the shape of the organic EL device 1 in planar view is not particularly limited in the present invention.

The dimensions of the organic EL device 1 having substantially a strip-like shape in planar view are not particularly limited, and the width-to-length ratio of the organic EL device 1 is typically 1:3 to 1:20, preferably 1:3 to 1:10.

As shown in FIGS. 1 and 2, the organic EL device 1 of the present invention includes a substrate 2, an organic EL element 3 provided on the substrate 2, and a photocatalyst layer 4.

The organic EL element 3 includes a first conductive layer 31 provided on the substrate 2, an organic EL layer 32 provided on the first conductive layer 31, and a second conductive layer 33 provided on the organic EL layer 32.

In FIG. 1, the first conductive layer 31 is laminated on the top surface of the substrate 2. The organic EL layer 32 is laminated on the top surface of the first conductive layer 31. The second conductive layer 33 is laminated on the top surface of the organic EL layer 32.

The first conductive layer 31 is comprised of a first terminal portion 311 disposed on the outer side of the organic EL layer 32, and a first electrode portion 312 disposed under the organic EL layer 32. The second conductive layer 33 is comprised of a second terminal portion 331 disposed on the outer side of the organic EL layer 32, and a second electrode portion 332 disposed on the organic EL layer 32.

The terminal portions 311 and 331 are portions of the first and second conductive layer 31 and 33, and receive the electricity supplied from an external power supply (not illustrated). Specifically, the terminal portions 311 and 331 are portions of the conductive layers 31 and 33, and are exposed to ambient air. In FIG. 2, the terminal portions 311 and 331 are provided on the top surface of the substrate 2. When an insulating layer is provided between the organic EL element 3 and the substrate 2, the terminal portions 311 and 331 are provided on the top surface of the insulating layer, as will be described later.

As shown in FIGS. 1 and 2, the first terminal portion 311 is provided at one end of the organic EL device 1 relative to width direction (the left-hand side in FIG. 1), and the second terminal portion 331 is provided at the other end of the organic EL device 1 relative to width direction (the right-hand side in FIG. 1). The terminal portions 311 and 331 are provided in a form of a strip from one end (upper side in FIG. 1) to the other end (lower side in FIG. 1) of the organic EL device 1 relative to length direction.

Connecting means (not illustrated), such as lead lines, is connected to the first terminal portion 311 and the second terminal portion 331. The connecting means is connected to an external power supply, and the electricity supplied from the external power supply is supplied to the first terminal portion 311 and the second terminal portion 331 via the connecting means.

The first electrode portion 312 is a portion that is continuous to the first terminal portion 311. The second electrode portion 332 is a portion that is continuous to the second terminal portion 331. The first electrode portion 312 and the first terminal portion 311 are formed as an integral portion. The second electrode portion 332 and the second terminal portion 331 are formed as an integral portion. The first electrode portion 312 is disposed in contact with the back surface of the organic EL layer 32. The second electrode portion 332 disposed in contact with the top surface of the organic EL layer 32. The electricity received at the terminal portions 311 and 331 is thus supplied to the organic EL layer 32 through the electrode portions 312 and 332, and the organic EL layer 32 emits light.

In this specification, the organic EL device 1 is described through the case where the first conductive layer 31 is an anode layer, and the second conductive layer 33 is a cathode layer. However, the organic EL device 1 of the present invention may be adapted so that the first conductive layer 31 is a cathode layer, and the second conductive layer 33 is an anode layer.

The organic EL element 3 has a light-emitting region 34. The light-emitting region 34 represents a surface of the outermost member or portion of the organic EL element 3, and corresponds to the organic EL layer 32. Most of the light emitted by the organic EL layer 32 emerges from the organic EL element 3 through the light-emitting region 34.

When the organic EL element 3 is top-emission type that basically emits light from the top, the light-emitting region 34 represents the top surface of the outermost member or portion of the organic EL element 3. When the organic EL element 3 is a bottom-emission device that basically emits light from the bottom, the light-emitting region 34 represents the back surface of the lowermost member or portion of the organic EL element 3. Specifically, the organic EL layer 32 is on the lower side of the light-emitting region 34 when the organic EL element 3 is the top-emission type, and is on the upper side of the light-emitting region 34 when the organic EL element 3 is a bottom-emission device.

In an embodiment of the present invention, the light-emitting region 34 represents the top surface of the second conductive layer 33 (second electrode portion 332) on the uppermost side of the organic EL element, as shown in FIGS. 1 and 2. Specifically, the organic EL element 3 used in the present embodiment is the top-emission type. In FIG. 1, an area corresponding to the light-emitting region 34 is marked with a grid-like pattern for convenience.

In the organic EL device 1 of the present invention, the photocatalyst layer 4 covers all or part of the light-emitting region 34. Accordingly, the emitted light from the organic EL layer 32 emerges from the organic EL device 1 through the photocatalyst layer 4. The excitation light from the organic EL layer 32 activates the photocatalyst layer 4, and decomposes organic contaminants in air. Preferably, the photocatalyst layer 4 covers all of the light-emitting region 34, as shown in FIGS. 1 and 2. When the photocatalyst layer 4 covers part of the light-emitting region 34, the photocatalyst layer 4 covers preferably at least 50%, more preferably at least 60%, further preferably at least 70% of the whole top surface area of the light-emitting region 34.

The following describes the configurations of the members and portions of the organic EL device 1.

Substrate

The substrate is a plate-shaped member on which the organic EL element is laminated.

The substrate material is not particularly limited. Examples of substrate materials include glass, ceramic, metal, and synthetic resin. The substrate may be transparent or nontransparent. However, a transparent substrate is used when forming a bottom-emission organic EL device.

It is preferable that the substrate has excellent radiation performance to prevent temperature increase in the organic EL device during driving, and that the substrate has moisture resistance to prevent moisture from contacting the organic EL layer.

Considering radiation performance and moisture resistance, it is preferable to use metal as the substrate material. When using metal as the substrate material, it is preferable to provide an insulating layer on the top surface of the substrate to prevent shorting between the substrate, and the first conductive layer (anode layer) and the second conductive layer (cathode layer).

When using synthetic resin as the substrate material. Examples of the synthetic resin include polyester resins such as polyethylene terephthalate (PET), polyethylene naphthalate (PEN), and polybutylene terephthalate (PBT); olefinic resins with α-olefin monomer components such as polyethylene (PE), polypropylene (PP), polymethylpentene (PMP), an ethylene-propylene copolymer, and an ethylene-vinyl acetate copolymer (EVA); polyvinyl chloride (PVC); vinyl acetate resins; polycarbonates (PC); polyphenylene sulfide (PPS); amide resins such as polyamides (nylons), and wholly aromatic polyamides (aramids); polyimide resins; and polyether ether ketone (PEEK). Preferred for use are polyimide resins.

When using metal as the substrate material. Examples of the metal include stainless steel, iron, aluminum, nickel, cobalt, copper, and alloys thereof. Preferred for use is stainless steel.

Preferably, the substrate is flexible. Examples of materials of flexible substrates include copper, and aluminum.

As used herein, "flexible" means that the substrate has the property to undergo hardly any deformation in all radial directions within its plane, but greatly deform (bend) in thickness direction under applied force. Specifically, the term "flexible" means that the substrate will not break or crack even when the substrate were rolled around a round rod having a diameter of $x^{1/2} \times 10$ (cm), where x is the thickness (μm) of the substrate. (The same applies to other members.)

The thickness of the substrate is not particularly limited, and is typically 10 μm to 100 μm, preferably 20 μm to 50 μm. The shape of the substrate in planar view is not limited either, and may be appropriately varied according to the layout of the laminated organic EL element. In the present invention, the substrate is substantially rectangular (strip-like) in planar view, as illustrated in FIG. 1.

Organic EL Element

The organic EL element 3 includes the first conductive layer 31 (anode layer), the organic EL layer 32, and the second conductive layer 33 (cathode layer), which are laminated in this order on the substrate 2.

The organic EL layer is a laminate of at least two functional layers. The organic EL layer may have, for example, (A) a three-layer structure of a hole transport layer, a light-emitting layer, and an electron transport layer, (B) a two-layer structure of a hole transport layer and a light-emitting layer, or (C) a two-layer structure of a light-emitting layer and an electron transport layer. In the organic EL layer of the structure (B), the light-emitting layer also serves as an electron transport layer. In the organic EL layer of the structure (C), the light-emitting layer also serves as a hole transport layer.

The organic EL layer in the organic EL device of the present invention may have any of the structures (A) to (C) above. The organic EL devices represented in FIGS. 1 to 4 all have structure (A). Specifically, the organic EL devices of FIGS. 1 to 4 include the organic EL layer 32 of a three-layer structure in which a hole transport layer 321, a light-emitting layer 322, and an electron transport layer 323 are laminated in this order from the bottom.

The hole transport layer 321 included in the organic EL layer 32 functions to inject holes into the light-emitting layer 322. The electron transport layer 323 functions to inject electrons into the light-emitting layer 322.

Passing current through the first and second terminal portions 311 and 331 causes recombination of the holes and electrons injected into the light-emitting layer 322 from the first and second electrode portions 312 and 332, and produces excitons. The light-emitting layer 322 emits light upon the excitons returning to the ground state.

The following describes the first conductive layer 31 (anode layer), the hole transport layer 321, the light-emitting layer 322, the electron transport layer 323, and the second conductive layer 33 (cathode layer) of the organic EL element 3.

The first conductive layer (anode layer) is formed of a conductive film.

The anode layer material is not particularly limited. Examples include indium tin oxide (ITO); indium tin oxide containing silicon oxide (ITSO); aluminum; gold; platinum; nickel; tungsten; copper; and alloys. The anode layer may be transparent or nontransparent. However, a transparent material is used when forming a bottom-emission organic EL device. The thickness of the anode layer is not particularly limited, and is typically 0.01 μm to 1.0 μm.

The anode layer may be formed using a method as may be selected to suit the material used. Examples include a sputter method, a vapor deposition method, and an inkjet method. For example, a vapor deposition method is used when metal is used to form the anode.

The hole transport layer is provided on the top surface of the anode layer. The hole transport layer is a layer that functions to inject holes into the light-emitting layer.

The hole transport layer material is not particularly limited, as long as it has a hole transporting function. Examples of the hole transport layer material include aromatic amine compounds such as 4,4',4"-tris(carbazol-9-yl)-triphenylamine (or simply TcTa); carbazole derivatives such as 1,3-bis(N-carbazolyl)benzene; spiro compounds such as N,N'-bis(naphthalen-1-yl)-N,N'-bis(phenyl)-9,9'-spirobisfluorene (or simply spiro-NPB); and high molecular compounds. The hole transport layer material may be used either alone or in a combination of two or more. The hole transport layer may have a multilayer structure with two or more layers.

The thickness of the hole transport layer is not particularly limited. However, the thickness is preferably 1 nm to 500 nm from the standpoint of lowering the drive voltage of the organic EL device.

The hole transport layer may be formed using a method as may be selected to suit the material used. Examples include a sputter method, a vapor deposition method, an inkjet method, and a coating method.

The light-emitting layer is provided on the top surface of the hole transport layer.

The light-emitting layer material is not particularly limited, as long as it has a light-emitting property. For example, low-molecular light-emitting materials such as low-molecular fluorescent light-emitting materials, and low-molecular phosphorescent light-emitting materials may be used. The photocatalyst layer of the present invention preferably contains a visible-light responsive photocatalyst, as will be described later. Because a visible-light responsive photocatalyst is easily excitable with blue light, the light-emitting layer is preferably made of materials that can emit blue light.

Examples of the low-molecular light-emitting materials include:

aromatic dimethylidene compounds such as, 4'-bis(2,2'-diphenylvinyl)-biphenyl (or simply DPVBi);

oxadiazole compounds such as
5-methyl-2-[2-[4-(5-methyl-2-benzooxazolyl)phenyl]vinyl]benzooxazole;

triazole derivatives such as
3-(4-biphenylyl)-4-phenyl-5-t-butylphenyl-1,2,4-triazole;

styrylbenzene compounds such as 1,4-bis(2-methylstyryl)benzene;

benzoquinone derivatives;

naphthoquinone derivatives;

anthraquinone derivatives;

fluorenone derivatives; and organometallic complexes such as an azomethine zinc complex, and tris(8-quinolinolato)aluminum ($Alq_3$).

The thickness of the light-emitting layer is not particularly limited, and is preferably, for example, 2 nm to 500 nm.

The light-emitting layer may be formed using a method as may be selected to suit the material used. Typically, the light-emitting layer is formed using a vapor deposition method.

The electron transport layer is provided on the top surface of the light-emitting layer (the back surface of the cathode layer). The electron transport layer functions to inject electrons into the light-emitting layer.

The electron transport layer material is not particularly limited, as long as it has an electron transporting function. Examples of the electron transport layer material include:

metal complexes such as tris(8-quinolinolato)aluminum (or simply Alq$_3$), and bis(2-methyl-8-quinolinolato)(4-phenylphenolate)aluminum (or simply BAlq);

heteroaromatic compounds such as 2,7-bis[2-(2,2'-bipyridin-6-yl)-1,3,4-oxadiazo-5-yl]-9,9-dimethylfluorene (or simply Bpy-FOXD), 2-(4-biphenylyl)-5-(4-tert-butylphenyl)-1,3,4-oxadiazole (or simply PBD), 1,3-bis[5-(p-tert-butylphenyl)-1,3,4-oxadiazol-2-yl]benzene (or simply OXD-7), and 2,2',2''-(1,3,5-phenylene)-tris(1-phenyl-1H-benzimidazole)(or simply TPBi); and high molecular compounds such as poly(2,5-pyridine-diyl) (or simply PPy).

The electron transport layer material may be used either alone or in a combination of two or more. The electron transport layer may have a multilayer structure with two or more layers.

The thickness of the electron transport layer is not particularly limited. However, the thickness is preferably 1 nm to 500 nm from the standpoint of lowering the drive voltage of the organic EL device.

The electron transport layer may be formed using a method as may be selected to suit the material used. Examples include a sputter method, a vapor deposition method, an inkjet method, and a coating method.

The second conductive layer (cathode layer) is formed of a conductive film.

The cathode layer material is not particularly limited. Examples of the conductive cathode layer material include indium tin oxide (ITO); indium tin oxide containing silicon oxide (ITSO); zinc oxide (ZnO:Al) with an added conductive metal such as aluminum; and magnesium-silver alloys. The cathode layer may be transparent or nontransparent. However, a transparent material (for example, ITO) is used when forming a top-emission type organic EL device. The thickness of the cathode layer is not particularly limited, and is typically 0.01 µm to 1.0 µm.

The cathode layer may be formed using a method as may be selected to suit the material used. Examples include a sputter method, a vapor deposition method, and an inkjet method. For example, a sputter method is used when ITO is used to form the cathode layer, and a vapor deposition method is used when the cathode layer is formed as a magnesium-silver alloy film, or a magnesium-silver laminated film.

The organic EL element may have a protective film or a sealing plate (not illustrated) on the second conductive layer (cathode layer), as required.

The protective film functions to prevent the conductive layers and the organic EL layer from being scratched. The protective film material is not particularly limited. Examples include metals and metalloids. Preferred examples include oxides, oxynitrides, nitrides, and oxycarbonitrides of these. Examples of oxides of metals or metalloids include MgO, SiO, Si$_x$O$_y$ (X>0, Y>0), Al$_2$O$_3$, GeO, and Ti$_2$O. The protective film may be transparent or nontransparent. However, a transparent protective film is used when forming a top-emission type organic EL device. The thickness of the protective film is not particularly limited, and is, for example, 50 nm to 10 µm.

The sealing plate has moisture resistance, and functions to prevent moisture and oxygen from contacting the organic EL layer of the organic EL element. The sealing plate material is not particularly limited, as long as it has moisture resistance. Preferred for use are synthetic resins, for example, such as an ethylene tetrafluoroethylene copolymer (ETFE), high-density polyethylene (HDPE), oriented polypropylene (OPP), polystyrene (PS), polymethylmethacrylate (PMMA), oriented nylon (ONy), polyethylene terephthalate (PET), polycarbonates (PC), polyimides, polyether styrene (PES), and polyethylene naphthalate (PEN). The sealing plate may be transparent or nontransparent. However, a transparent sealing plate is used when forming a top-emission type organic EL device. The thickness of the sealing plate is not particularly limited, and is, for example, 5 µm to 1 mm, preferably 10 µm to 200 µm.

Photocatalyst Layer

The photocatalyst layer is a layer that covers all or part of the light-emitting region of the organic EL element. As illustrated in FIG. 2, the photocatalyst layer 4 includes at least a photocatalyst 41 and a co-catalyst 42. In FIG. 2, the photocatalyst 41 and the co-catalyst 42 are shown as being particulate in shape. However, the shapes of the photocatalyst 41 and the co-catalyst 42 are not particularly limited in the present invention.

The following describes the photocatalyst and the co-catalyst contained in the photocatalyst layer.

Photocatalyst

Photocatalysts are a substance that shows photocatalytic activity upon being irradiated with light of specific wavelengths (excitation light having a higher energy than the band gap between the valence and the conduction band of the photocatalyst).

Examples of the photocatalyst include:

metal oxides such as anatase-type or rutile-type titanium (IV) oxide (TiO$_2$), tungsten(III) oxide (W$_2$O$_3$), tungsten(IV) oxide (WO$_2$), tungsten(VI) oxide (WO$_3$), zinc oxide (ZnO), iron(III) oxide (Fe$_2$O$_3$), strontium titanate (SrTiO$_3$), bismuth (III) oxide (Bi$_2$O$_3$), bismuth vanadate (BiVO$_4$), tin(II) oxide (SnO), tin(IV) oxide (SnO$_2$), tin(VI) oxide (SnO$_3$), zirconium oxide (ZrO$_2$), cerium(II) oxide (CeO), cerium(IV) oxide (CeO$_2$), barium titanate (BaTiO$_3$), indium(III) oxide (In$_2$O$_3$), copper(I) oxide (Cu$_2$O), copper(II) oxide (CuO), potassium tantalate (KTaO$_3$), and potassium niobate (KNbO$_3$);

metal sulfides such as cadmium sulfide (CdS), zinc sulfide (ZnS), and indium sulfide (InS);

metal selenides such as cadmium selenate (CdSeO$_4$), and zinc selenide (ZnSe); and metal nitrides such as gallium nitride (GaN).

The photocatalysts exemplified above may be obtained by using methods, for example, such as solid-phase reaction, combustion synthesis, solvothermal synthesis, pyrolysis, and plasma synthesis. Preferably, the photocatalyst is obtained by using the radio frequency inductively coupled plasma (RF-ICP) technique. RF-ICP has high production efficiency, and can produce a high-purity photocatalyst. For example, the photocatalyst may be obtained under the RF-ICP conditions described in U.S. Pat. No. 8,003,563.

The activity of the photocatalyst can be improved by doping an element of certain species. Such an element may be called a "dopant", and examples of such dopants include alkali metals such as lithium (Li), sodium (Na), potassium (K), and cesium (Cs); alkali earth metals such as magnesium (Mg), calcium (Ca), strontium (Sr), and barium (Ba); noble metals such as gold (Au), platinum (Pt), rhodium (Rh), iridium (Ir), palladium (Pd), and ruthenium (Ru); transition metals such as iron (Fe), titanium (Ti), zinc (Zn), copper (Cu), tungsten (W), manganese (Mn), niobium (Nb), nickel (Ni), zirconium (Zr), and cerium (Ce); other metals such as tin (Sn), and aluminum (Al); metalloids such as boron (B), and arsenic (As); nonmetals such as nitrogen (N), carbon (C), sulfur (S), fluorine (F), and selenium (Se); and compounds containing such metals and nonmetals. In this specification, a photocatalyst doped with a dopant will be referred to as "doped-type photocatalyst".

The term "doping" means adding an arbitrarily chosen element (dopant) to the host compound crystals within a range that essentially does not change the basic crystalline structure of the photocatalyst. Whether the photocatalyst is doped or not can be confirmed by, for example, a peak shift in XPS (X-ray photoelectron spectroscopy). Methods used for forming the doped-type photocatalyst are not particularly limited, and may be, for example, a sol-gel method, a solid-phase reaction method, and an ion implantation method.

When the photocatalyst is a doped-type photocatalyst, the molar ratio of the host compound (compound subjected to doping) and the dopant in the photocatalyst is not particularly limited, and is preferably 99.9:0.1 to 80:20, more preferably 99.9:0.1 to 85:15, further preferably 99.9:0.1 to 87:13.

Preferably, the doped-type photocatalyst is doped with at least one selected from carbon (C), nitrogen (N), sulfur (S), fluorine (F), tin (Sn), zinc (Zn), manganese (Mn), aluminum (Al), selenium (Se), niobium (Nb), nickel (Ni), zirconium (Zr), cerium (Ce), and iron (Fe).

The photocatalyst may be used either alone or in a combination of two or more. When two or more photocatalysts are used as a mixture, one of the photocatalysts may serve as a co-catalyst for the other photocatalyst.

The photocatalyst may be a p-type or an n-type. A p-type photocatalyst may be obtained, for example, by doping a photocatalyst with high valance elements (for example, such as arsenic (As)). An n-type photocatalyst may be obtained, for example, by doping a photocatalyst with low valence elements (for example, such as boron (B)).

It is preferable that the photocatalyst contains a metallic compound (such as an oxide, a nitride oxide, an oxynitride carbide, or a halide), and more preferably contains a titanium compound, a tin compound, or a tungsten compound.

The average oxidation number or formal charge of titanium in the titanium compound is preferably +1 to +6, more preferably +2 to +4, further preferably +1 to +3. The average oxidation number or formal charge of tin in the tin compound is preferably +2 to +8, more preferably +1 to +6, further preferably +1 to +4. The average oxidation number or formal charge of tungsten in the tungsten compound is preferably +1 to +8, more preferably +1 to +6, further preferably +1 to +4.

More specifically, the photocatalyst preferably contains at least one selected from titanium(IV) oxide ($TiO_2$), tin(IV) oxide ($SNO_2$), tungsten(III) oxide ($W_2O_3$), tungsten(IV) oxide ($WO_2$), and tungsten(VI) oxide ($WO_3$). As the titanium(IV) oxide ($TiO_2$), an anatase-type titanium(IV) oxide ($TiO_2$) is preferred.

Incidentally, in the present specification, the phrase that "the photocatalyst contains (comprises) tungsten(VI) oxide ($WO_3$)" includes not only a case where the photocatalyst is a pure tungsten(VI) oxide ($WO_3$) but also a case where the photocatalyst contains a tungsten(VI) oxide ($WO_3$) doped with another element or compound. (The same applies to photocatalysts and co-catalysts other than tungsten oxide.)

Especially, it is preferable that the photocatalyst contains tungsten(VI) oxide ($WO_3$) because it makes it possible to form a photocatalyst layer that shows a sufficient photoactivity with visible light.

The photocatalyst preferably has a refractive index (R1) of 1.0 to 4.0, more preferably 1.0 to 3.0, particularly preferably 1.5 to 2.5 at a wavelength of 589 nm. With the photocatalyst refractive index (R1) falling in the range of 1.0 to 4.0, it becomes easier to reduce the refractive index difference from the co-catalyst, and thus becomes easier to form a translucent photocatalyst layer. Note that the refractive index values of the photocatalyst are measured values obtained with an Abbe refractometer according to the "Solid Sample Measurement Method" specified by JIS K 0062.

The shape of the photocatalyst is not particularly limited, but the photocatalyst is preferably particulate in shape. Many kinds of photocatalysts are poorly soluble in solvent. With the particulate shape, the photocatalyst can be dispersed in a dispersion medium to produce a dispersion liquid, which can then be used to easily form the photocatalyst layer by being coated and dried.

When the photocatalyst is particulate in shape, the average particle size of the photocatalyst is not particularly limited, and is preferably 5 nm to 1,000 nm, more preferably 5 nm to 100 nm, further preferably 5 nm to 30 nm. When the average particle size of the photocatalyst exceeds 1,000 nm, the overall surface area of the photocatalyst becomes smaller, and the co-catalyst may not sufficiently contact the photocatalyst, with the result that the photocatalyst layer may fail to show sufficient photocatalytic activity. On the other hand, when the average particle size of the photocatalyst falls below 5 nm, particle aggregation tends to occur, and the photocatalyst layer may suffer from poor translucency.

Note that the average particle size of the photocatalyst is a volume-based 50% cumulative distribution diameter (D50) of photocatalyst particles dispersed in an arbitrary dispersion liquid as determined by dynamic light scattering frequency analysis (FFT-heterodyne method).

Co-Catalyst

Co-catalysts are a substance that accelerates the photocatalytic activity of the photocatalyst. The co-catalyst may be one that shows or does not show photocatalytic activity by itself. In cooperation with the photocatalyst, the co-catalyst can increase the reaction rate of the photocatalyst by 1.2 fold or more, preferably 1.5 fold or more, further preferably 2.0 fold or more, particularly preferably 3.0 fold or more from that when the photocatalyst is used alone. The reaction rate of the photocatalyst may be based on, for example, the decomposition rate of acetaldehyde, a type of volatile organic compounds (VOCs).

Specifically, the photocatalyst, either alone or with the co-catalyst mixed with or supported by the photocatalyst, is put in a closed space charged with certain quantities of compressed air and acetaldehyde (calibration gas), and irradiated with visible light (wavelength 455 nm, irradiation intensity 200 mW/cm$^2$) for 1 hour. The acetaldehyde concentrations in the closed space before and after the irradiation are then compared to calculate the factor by which the reaction rate of the photocatalyst increased. For example, the acetaldehyde decomposition rate can be said to have increased 3 fold (a 3-fold increase of photocatalytic activity) when the acetaldehyde concentration in a closed space charged with the photocatalyst and the co-catalyst (either mixed with the photocatalyst or supported on the photocatalyst) becomes 20 ppm after the irradiation of the closed space containing 80 ppm of acetaldehyde (i.e., 60 ppm of acetaldehyde has decomposed) as compared to when the acetaldehyde concentration in a closed space charged with the photocatalyst alone becomes 60 ppm after the irradiation of the closed space containing 80 ppm of acetaldehyde (i.e., 20 ppm of acetaldehyde has decomposed).

Examples of the co-catalyst include copper(I) oxide ($Cu_2O$), copper(II) oxide (CuO), yttrium(III) oxide ($Y_2O_3$), molybdenum(VI) oxide ($MoO_3$), manganese(III) oxide ($Mn_2O_3$), gadolinium(III) oxide ($Gd_2O_3$), anatase-type or rutile-type titanium(IV) oxide ($TiO_2$), strontium titanate ($SrTiO_3$), potassium tantalate ($KTaO_3$), silicon carbide (SiC), potassium niobate ($KNbO_3$), silicon oxide ($SiO_2$), tin(IV) oxide ($SnO_2$), aluminum(III) oxide ($Al_2O_3$), zirconium oxide ($ZrO_2$), iron(III) oxide ($Fe_2O_3$), iron(II,III) oxide ($Fe_3O_4$), nickel(II) oxide (NiO), niobium(V) oxide ($Nb_2O_5$), indium oxide ($In_2O_5$), tantalum oxide ($Ta_2O_5$), cerium(II) oxide (CeO), cerium(IV) oxide ($CeO_2$), $A_rX_tO_s$ (A is a rare earth element, X is an element other than rare earth elements, or a combination of elements other than rare earth elements, r is 1 to 2, t is 0 to 3, and s is 2 to 3), ammonium phosphomolybdate trihydrate (($NH_4)_3[PMo_{12}O_{40}]$), 12-tungstophosphoric acid ($PW_{12}O_{40}$), silicotungstic acid ($H_4[SiW_{12}O_{40}]$), phosphomolybdic acid ($12MoO_3.H_3PO_4$), and cerium-zirconium composite oxide ($Ce_xZr_yO_2$)(y/x=0.001 to 0.999).

The co-catalyst may be simply mixed with the photocatalyst, or may be supported on the photocatalyst. In this specification, a photocatalyst supporting the co-catalyst is referred to as "supporting-type photocatalyst". As used herein, the term "supporting" refers to the state where a substance different from the photocatalyst is adhering to the photocatalyst surface. Such an adhering state can be observed, for example, by scanning electron microscopy. Methods used for forming the supporting-type photocatalyst are not particularly limited, and may be, for example, an impregnation method, a photoreduction method, or sputtering. The supporting-type photocatalyst may be formed by using the method described in, for example, US Patent Application Publication No. 2008/0241542. The co-catalyst may be doped with a dopant. A co-catalyst doped with a dopant will be referred to as doped-type co-catalyst. The compounds and elements used to dope the co-catalyst are as exemplified above in conjunction with the photocatalyst.

The co-catalyst preferably contains at least one selected from a cerium compound, a copper compound, a potassium compound, a strontium compound, a tantalum compound, a niobium compound, and a titanium compound. More preferably, the co-catalyst contains a cerium compound, or a copper compound. The average oxidation number or formal charge of cerium in the cerium compound is preferably +2 to +4. The average oxidation number or formal charge of copper in the copper compound is preferably +1 to +2.

In one embodiment of the invention, the co-catalyst contains cerium oxide, more preferably cerium(IV) oxide ($CeO_2$). This embodiment is suited for use in decomposition of volatile organic compounds (VOCs). When the co-catalyst contains cerium(IV) oxide ($CeO_2$), it is preferable to dope the cerium(IV) oxide, preferably with tin (Sn). In the tin (Sn)-doped cerium(IV) oxide ($CeO_2$:Sn), the tin (Sn) accounts for preferably 1 mol % to 50 mol %, more preferably 1.5 mol % to 10 mol %, further preferably 1.5 mol % to 10 mol %, particularly preferably 1.5 mol % to 4.5 mol % of the total co-catalyst ($CeO_2$:Sn).

In another embodiment of the invention, the co-catalyst contains copper oxide, more preferably copper(I) oxide ($Cu_2O$) and/or copper(II) oxide (CuO). This embodiment is suited for anti-microbial applications. When the co-catalyst contains copper(I) oxide ($Cu_2O$) and/or copper(II) oxide (CuO), it is preferable that the copper(I) oxide ($Cu_2O$) and/or copper(II) oxide (CuO) are supported on the photocatalyst.

The shape of the co-catalyst is not particularly limited, but the co-catalyst is preferably particulate in shape for the same reasons described for the photocatalyst. When the co-catalyst is particulate in shape, the average particle size of the co-catalyst is not particularly limited, and is preferably 1 nm to 1,000 nm, more preferably 1 nm to 100 nm, further preferably 1 nm to 30 nm.

The co-catalyst has a refractive index (R2) of preferably 1.0 to 4.0, more preferably 1.0 to 3.0, particularly preferably 1.5 to 2.5 at 589 nm wavelength. With the co-catalyst refractive index (R2) falling in the range of 1.0 to 4.0, it becomes easier to reduce the refractive index difference from the photocatalyst, and form a desirably translucent photocatalyst layer.

Examples of the photocatalyst described above include a UV responsive photocatalyst that shows photocatalytic activity only with ultraviolet rays of less than 380 nm wavelength, and a visible-light responsive photocatalyst that shows photocatalytic activity also with visible light of 380 nm to 780 nm wavelengths. In the present invention, the photocatalyst may be a UV responsive photocatalyst or a visible-light responsive photocatalyst, and is preferably a visible-light responsive photocatalyst. The visible-light responsive photocatalyst shows some photoactivity with visible light even without the co-catalyst. The visible-light responsive photocatalyst, in cooperation with the co-catalyst, can thus show even higher photoactivity with visible light. When the photocatalyst is a visible-light responsive photocatalyst, the band gap is, for example, 1.5 eV to 3.5 eV, preferably 1.7 eV to 3.3 eV, more preferably 1.77 eV to 3.27 eV. Note that the photocatalyst may show visible-light responsiveness in certain photocatalyst and co-catalyst combinations even when the photocatalyst is a UV responsive photocatalyst.

In the present invention, the photocatalyst is preferably one that shows visible-light responsiveness. A visible-light responsive photocatalyst can show photocatalytic activity also with a visible-light emitting light source such as a fluorescence lamp and an LED, making it possible to avoid use of ultraviolet light, which is harmful to human body.

Photocatalysts may be used either alone or as a mixture of two or more. When two or more photocatalysts are used as a mixture, one of the photocatalysts may function as the co-catalyst of the other photocatalyst. Co-catalysts may also be used alone or as a mixture of two or more.

The photocatalyst layer may contain other compounds (for example, such as a binder resin), as long as the photocatalyst and the co-catalyst are contained.

As is apparent, such additional compounds in the photocatalyst layer may involve a large refractive index difference from the photocatalyst or the co-catalyst, and sufficient translucency may not be ensured for the photocatalyst layer.

It is accordingly preferable that the photocatalyst layer is configured substantially solely from the photocatalyst and the co-catalyst. As used herein, the photocatalyst layer being configured substantially solely from the photocatalyst and the co-catalyst means that the photocatalyst and the co-catalyst account for at least 80 mass %, preferably at least 90 mass % of the total photocatalyst layer.

The ratio (molar ratio) of the total photocatalyst and the total co-catalyst is preferably 99.5:0.5 to 16.7:83.3, more preferably 99.5:0.5 to 20:80, further preferably 99.5:0.5 to 50:50.

When the photocatalyst content is less than the lower limit of the foregoing ranges, the co-catalyst will be in excess of the photocatalyst amount, and the photocatalyst layer may fail to show sufficient photocatalytic activity. On the other hand, when the photocatalyst content exceeds the upper limit of the foregoing ranges, the co-catalyst will be deficient relative to the photocatalyst amount, and the photocatalyst layer may fail to show sufficient photocatalytic activity.

In the photocatalyst layer of the present invention, the absolute value of the difference (|R1−R2|) between the refractive index (R1) of the photocatalyst and the refractive index (R2) of the co-catalyst at a wavelength of 589 nm is 0 to 0.35, preferably 0 to 0.30, more preferably 0 to 0.20, particularly preferably 0 to 0.16. Note that |R1−R2|=0 means that the refractive index (R1) of the photocatalyst and the refractive index (R2) of the co-catalyst are the same. In the photocatalyst layer, the photocatalyst and the co-catalyst have the same refractive index, or have a refractive index difference of more than 0 and 0.35 or less.

With the refractive index difference of the photocatalyst and the co-catalyst falling in the foregoing ranges, the emitted light from the organic EL element more easily passes through the photocatalyst layer than being refracted therein (the photocatalyst layer will have increased translucency). This makes it possible to form an organic EL device with a photocatalyst layer having superior translucency.

In the present invention, the combination of the photocatalyst and the co-catalyst contained in the photocatalyst layer is not particularly limited, and may be selected from any combinations that satisfy the foregoing refractive index difference ranges.

In a preferred embodiment, the photocatalyst contains tungsten(VI) oxide ($WO_3$), and the co-catalyst contains cerium(IV) oxide ($CeO_2$). With tungsten(VI) oxide ($WO_3$) used as the photocatalyst and cerium(IV) oxide ($CeO_2$) used as the co-catalyst, a photocatalyst layer can be formed that has excellent visible-light responsiveness and excellent photocatalytic activity, and that excels particularly in volatile organic compound (VOC) decomposition property.

In another preferred embodiment, the photocatalyst contains titanium(IV) oxide ($TiO_2$), and the co-catalyst contains copper(I) oxide ($Cu_2O$) and/or copper(II) oxide (CuO). In this case, it is preferable that the co-catalyst containing copper(I) oxide ($Cu_2O$) and/or copper(II) oxide (CuO) be supported on the photocatalyst containing titanium(IV) oxide ($TiO_2$). With titanium(IV) oxide ($TiO_2$) used as the photocatalyst and copper(I) oxide ($Cu_2O$) and/or copper(II) oxide (CuO) used as the co-catalyst, a photocatalyst layer can be formed that has excellent visible-light responsiveness and excellent photocatalytic activity, and that excels particularly in anti-microbial property. In this specification, a co-catalyst-supporting type photocatalyst supporting a co-catalyst CuO on a photocatalyst $TiO_2$ may be represented by $Cu_xO$—$TiO_2$. Here, "$Cu_xO$" is intended to mean a state where two types of copper oxides, CuO (X=1; copper(II) oxide) and $Cu_2O$ (X=2; copper(I) oxide) are present.

The thickness of the photocatalyst layer is not particularly limited. As is evident, the translucency of the photocatalyst layer may decrease when the photocatalyst layer is too thick. On the other hand, a photocatalyst layer may fails to show sufficient photocatalytic activity when it is too thin.

Considering these, the thickness of the photocatalyst layer is preferably 0.1 μm to 20 μm, more preferably 0.1 μm to 5.0 μm, further preferably 1.0 μm to 5.0 μm, particularly preferably 1.0 μm to 2.0 μm.

The photocatalyst layer has a visible light transmittance of preferably 70% or more, more preferably 80% or more, particularly preferably 90% or more. The photocatalyst layer has a transmittance of preferably 80% or more, more preferably 90% or more for light of 589 nm wavelength.

The visible light transmittance value is a measured value according to JIS R 3106.

The method for forming the photocatalyst layer is not particularly limited. The photocatalyst layer is formed using, for example, dry deposition methods such as high velocity flame spraying (high velocity oxygen fuel, or HVOF for short), cold spraying, atomic layer deposition (ALD), chemical vapor deposition (CVD), and physical vapor deposition (PVD), or wet deposition methods such as spin coating, and dip coating.

The photocatalyst layer is provided on the upper side or lower side of the organic EL element. However, the organic EL layer of the organic EL element has low heat resistance, and may denature under high temperature. It is therefore preferable to form the photocatalyst layer using the wet deposition method, which can be used at relatively low temperatures.

Organic EL Device Producing Method

The method for producing the photocatalyst layer-attached organic EL device of the present invention is not particularly limited. For example, the method has the following steps.

Step 1: Step of laminating the organic EL element on the substrate.

Step 2: Step of laminationg a dispersion containing the photocatalyst and the co-catalyst on the organic EL element, or under the substrate.

Step 3: Step of removing the dispersion medium from the laminated dispersion.

The following describes each step.

Step 1

The first conductive layer, the organic EL layer, and the second conductive layer are sequentially laminated on the substrate to form the organic EL element on the substrate. The layers are laminated as follows. When the organic EL element has a protective layer and/or a sealing plate, the protective layer and/or the sealing plate are laminated on the second conductive layer.

Step 2

A dispersion containing the photocatalyst and the co-catalyst is laminated on the organic EL element, or under the substrate. When the organic EL element is a top-emission type device, the dispersion is laminated on the organic EL element. The dispersion is laminated under the substrate when the organic EL element is a bottom-emission device.

The dispersion is a liquid with the photocatalyst and the co-catalyst dispersed in a dispersion medium. The dispersion medium is not particularly limited, as long as it can disperse the photocatalyst and the co-catalyst. For example, a volatile organic solvent, or a mixture of water and a volatile organic solvent is used. Preferably, the dispersion medium is water. When the dispersion medium is water, it does not contaminate the top surface of the photocatalyst even after being dried, and the photocatalyst layer can show desirable photocatalytic activity immediately after being dried.

When being laminated under the substrate, the dispersion may be laminated before laminating the organic EL element on the substrate.

The concentrations (molar concentrations) of the photocatalyst and the co-catalyst in the dispersion are not particularly limited, and may be appropriately adjusted, taking into account the concentrations of the photocatalyst and the co-catalyst in the photocatalyst layer formed. The concentration ratio of the photocatalyst and the co-catalyst in the dispersion is preferably 1:5 to 5:1, more preferably 1:3 to 3:1, further preferably 1:2 to 2:1, particularly preferably 1:1.

The method for laminating the dispersion is not particularly limited, and the dispersion is applied using, for example, methods such as gravure coating, reverse coating, spray coating, and dip coating. The dispersion is laminated so as to cover all or part of the light-emitting region. The organic EL device obtained upon removing the dispersion medium from the dispersion in a later step can thus have the photocatalyst layer covering all or part of the light-emitting region.

Step 3

The dispersion medium is thoroughly removed from the laminated dispersion to form the photocatalyst layer. The method for removing the dispersion medium is not particularly limited, and the dispersion medium removed preferably by drying. Drying may be natural drying, or the dispersion medium may be forcibly dried using a drier, or by a combination of natural drying and forced drying.

The drying temperature is not particularly limited, and may be appropriately adjusted, taking into account conditions such as the materials used for the photocatalyst, the co-catalyst, the dispersion, and the organic EL layer. The drying temperature is, for example, 20° C. to 150° C., preferably 20° C. to 80° C., more preferably 20° C. to 50° C.

The drying time is not particularly limited. However, the dispersion medium is dried for a time period that sufficiently dries the dispersion medium and forms the photocatalyst layer. The drying time is typically 1 minute to 10 minutes, preferably 1 minute to 5 minutes.

Variations of the present invention are described below. The following descriptions of variations will focus on configurations and effects different from those of the embodiments above, and the same configurations or other features already described in the foregoing embodiments may not be described, and the terms and reference numerals may be omitted.

First Variation

Figure 3:
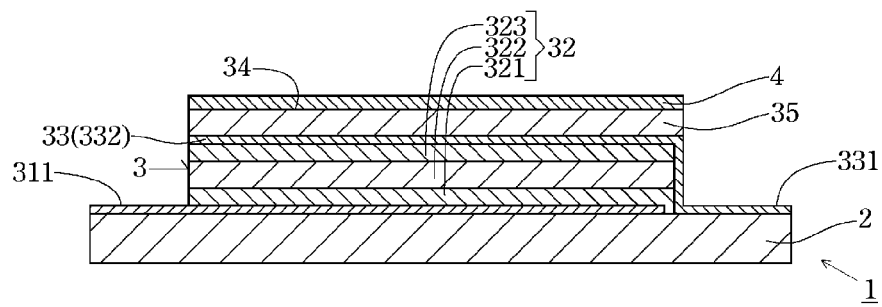
FIG. 3 is an enlarged cross sectional view of an organic EL device according to First Variation of the present invention.

FIG. 3 is an enlarged cross sectional view representing an organic EL device 1 according to First Variation of the present invention. The enlarged cross sectional view of the organic EL device 1 shown in FIG. 3 is a cross section taken at line II-II, as in FIG. 1 (the same is the case for FIG. 4).

As shown in FIG. 3, the organic EL element 3 of the organic EL device 1 according to First Variation of the present invention has a transparent insulating layer 35. The insulating layer 35 is provided on the top surface of a second conductive layer 33 (second terminal portion 331). When the top surface of the second conductive layer 33 is in contact with the photocatalyst layer 4, potential changes occurring upon energization of the second conductive layer 33 may lower the photocatalytic activity of the photocatalyst layer 4. In this variation, the insulating layer 35 is provided to prevent the photocatalyst layer 4 and the second conductive layer 33 from contacting each other. This makes it possible to stabilize the photocatalytic activity of the photocatalyst layer 4.

The insulating layer 35 has a visible light transmittance of 80% or more, more preferably 90% or more, particularly preferably 95% or more.

The material of the insulating layer 35 is not particularly limited, as long as the foregoing visible light transmittances are satisfied. Examples include organic compounds such as silicone resin, polyimide resin, and epoxy resin, and inorganic compounds such as silicon oxide ($SiO_2$), silicon nitride ($Si_3N_4$), silicon oxycarbide (SiOC), and silicon oxynitride (SiON).

The thickness of the insulating layer 35 is not particularly limited, as long as the foregoing visible light transmittances are satisfied. The thickness is preferably 10 nm to 3.0 µm, more preferably 50 nm to 2.0 µm, further preferably 0.1 µm to 1 µm.

The insulating layer 35 may be formed by applying and laminating the material on the conductive layer 33 using methods, for example, such as chemical vapor deposition (CVD), sputtering, and spin coating.

Second Variation

Figure 4:
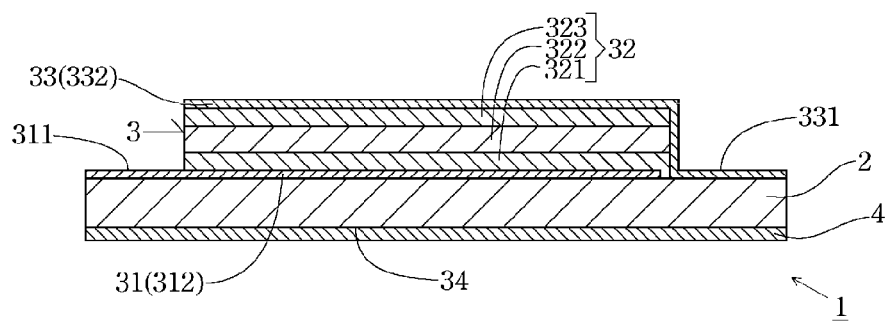
FIG. 4 is an enlarged cross sectional view of an organic EL device according to Second Variation of the present invention.

FIG. 4 is an enlarged cross sectional view representing an organic EL device 1 according to Second Variation of the present invention. In this variation, the organic EL element 3 is a bottom-emission device in which light is extracted from the lower side (the substrate 2 side). Accordingly, the light-emitting region 34 represents a portion of the back surface of the substrate 2 (a portion corresponding to the organic layer 322). The photocatalyst layer 4 is provided over the whole back surface of the substrate 2. Specifically, the photocatalyst layer 4 covers all of the light-emitting region 34.

In this variation, the emitted light from the organic EL element 2 emerges out via the photocatalyst layer 4, as in the foregoing embodiments, allowing the photocatalyst layer 4 to exhibit photocatalytic activity.

In the organic EL device of the present invention, the photocatalyst layer covers all or part of the light-emitting region of the organic EL element. The photocatalyst and the co-catalyst contained in the photocatalyst layer have a refractive index difference of 0 to 0.35 at a wavelength of 589 nm. This makes the photocatalyst layer desirably translucent.

In addition to having desirable translucency, the photocatalyst layer can exhibit desirable photocatalytic activity with visible light, particularly when the photocatalyst is tungsten(VI) oxide, and the co-catalyst is cerium(IV) oxide.

The organic EL device of the present invention, and the method of production thereof are not limited to the embodiments described above, and may be appropriately redesigned within the intended scope of the present invention.

The applicable areas of the organic EL device of the present invention are not particularly limited. For example, the organic EL device of the present invention is applicable to, preferably, room illumination, car interior illumination, and lighting in refrigerators.

EXAMPLES

The present invention is described below in greater detail using Examples and Comparative Examples. The following examples are not intended to limit the present invention. The samples used in Examples and Comparative Examples are purchased from Sigma Aldrich (USA), unless otherwise stated.

Photocatalytic Activity Measurement Method

In Examples and Comparative Examples, photocatalytic activity was measured using the following acetaldehyde decomposition rate measurement method, unless otherwise stated.

A sample as a photocatalytic activity measurement target was placed in a 5-L Tedlar bag in a vacuum. Compressed air (3 L) and a calibration acetaldehyde were then charged into the same Tedlar bag, and the acetaldehyde concentration was adjusted to 80 ppm. The acetaldehyde concentration was measured with a gas chromatography device (GC-FID) for calibration equipped with a high sensitivity hydrogen flame ionization detector (the Shimadzu product "GC-2010 plus").

The Tedlar bag was placed in the dark for 1 h to stabilize the acetaldehyde concentration (the concentration was brought to an equilibrium state). The Tedlar bag was then irradiated with light of a diode array emitting monochromatic blue light (wavelength 455 nm, irradiation intensity 200 mW/cm$^2$). After a certain photoirradiation period, the gas inside the Tedlar bag was collected, and analyzed with GC-FID. Regions corresponding to chromatogram peaks were used to specify time-course changes of acetaldehyde concentration.

The decomposition rate (%) of acetaldehyde was calculated according to the following formula A.

Formula A:

Acetaldehyde decomposition rate (%)=(X−Y)/X×100, where X is the acetaldehyde concentration (80 ppm) before photoirradiation, and Y is the acetaldehyde concentration after photoirradiation.

Percentage remaining acetaldehyde (%) was calculated according to the following formula B.

Formula B:

Percentage remaining acetaldehyde (%)=Y/X×100, where X and Y are as defined for formula A.

It can be said that the photocatalytic activity increases with increase of acetaldehyde decomposition rate (low percentage of remaining acetaldehyde), and decreases with decrease with acetaldehyde decomposition rate (high percentage of remaining acetaldehyde).

Photocatalyst and Co-catalyst Refractive Index Measurement Method

The refractive indices of the photocatalyst and the co-catalyst at 589 nm wavelength were measured with an Abbe refractometer, using the "solid sample measurement method" specified by JIS K 0062.

Example 1

Photocatalyst WO$_3$, Co-Catalyst: CeO$_2$

An organic EL element (the Lumiotec product, model "P03A0404N-A12A", luminance 2700 cd/m$^2$, rated voltage 10.5 V) was laminated on a substrate measuring 97.6 mm in length, 97.6 mm in width, and 2.1 mm in thickness (hereinafter, substrate-attached organic EL element).

Thereafter, a particulate photocatalyst (WO$_3$; 200 mg) was added to RO water (water passed through a reverse osmosis membrane) to produce a dispersion. The dispersion was added to 740 mg of a CeO$_2$ dispersion (Nissan Chemical Industries, trade name "NanoUse CE-20B") to prepare a mixture. The mixture contained WO$_3$ and CeO$_2$ at a molar ratio of 1:1. RO water (800 mg) was then added to the mixture to prepare a coating solution. The coating solution had a solid content of 20 wt %.

The coating solution so prepared was homogenized using a probe-type sonicator (sonic dismembrator, Model 100), and applied onto the organic EL element so as to cover the whole light-emitting region of the substrate-attached organic EL element. The coating solution was applied with a spin coater at a rotation speed of 1200 rpm for 40 s. The substrate-attached organic EL element with the laminated coating solution was heated at 40° C. for 15 min to produce a photocatalyst layer-attached organic EL device. The photocatalyst layer had a thickness of 0.2 μm.

The photocatalyst layer-attached organic EL device produced as above was caused to emit light, and the relative luminance (transmittance) was measured. Specifically, a voltage of 10.5 V was applied to the substrate-attached organic EL element before laminating the photocatalyst layer to cause emission from the substrate-attached organic EL element, and the luminance was measured. The luminance was 2700 cd/m$^2$. Thereafter, the photocatalyst layer-attached organic EL device was caused to emit light at 10.5 V, and the luminance was measured. The measured values were substituted in the formula C below to find the relative luminance (transmittance) of the photocatalyst layer-attached organic EL device.

Formula C:

Relative luminance (transmittance) (%)=W/V×100, where W is the luminance of the photocatalyst layer-attached organic EL device, and V is the luminance of the substrate-attached organic EL element (2700 cd/m$^2$).

The acetaldehyde decomposition rate was then measured after one hour of photoirradiation, using the photocatalytic activity measurement method above.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

Example 2

Photocatalyst WO$_3$, Co-Catalyst: CeO$_2$:Sn (2.5 mol %)

0.1196 g of tin (II) 2-ethylhexanoate (Spectrum Chemicals, USA), 5 g of Ce(NO$_3$)$_3$.6H$_2$O, and 3.0 g of ammonium nitrate (NH$_4$NO$_3$) were dissolved in 25 mL of RO water. Immediately after adding 1.129 g of maleic hydrazide, the mixture was heated at 150° C. while being stirred for 20 min.

The resulting precursor mixture was charged into a preheated muffle furnace (under the atmosphere and ordinary pressure), and heated at 450° C. for 40 min. The resulting particles were annealed at 500° C. for about 20 min. The annealed CeO$_2$ particles were mixed with particulate WO$_3$ (molar ratio 1:1) to prepare a coating solution in the same manner as in Example 1, and a photocatalyst layer-attached organic EL device was produced. The CeO$_2$ contained in the photocatalyst layer contained 2.5 mol % of tin (Sn) within the molecule. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

Example 3

Photocatalyst WO$_3$, Co-Catalyst: CeO$_2$:Sn (5.0 mol %)

A coating solution (the photocatalyst (WO$_3$) and the co-catalyst (CeO$_2$:Sn); molar ratio of 1:1) was prepared, and a photocatalyst layer-attached organic EL device was produced in the same manner as in Example 2, except that the tin(II) 2-ethylhexanoate and the maleic hydrazide were used in 0.245 g and 1.127 g, respectively. The CeO$_2$ contained in the photocatalyst layer contained 5.0 mol % of tin (Sn) within the molecule. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

Example 4

Photocatalyst $WO_3$, Co-Catalyst: $CeO_2$:Sn (7.5 mol %)

A coating solution (the photocatalyst ($WO_3$) and the co-catalyst ($CeO_2$:Sn); molar ratio of 1:1) was prepared, and a photocatalyst layer-attached organic EL device was produced in the same manner as in Example 2, except that the tin(II) 2-ethylhexanoate was used in 0.378 g. The $CeO_2$ contained in the photocatalyst layer contained 7.5 mol % of tin (Sn) within the molecule. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

Example 5

Photocatalyst $WO_3$, Co-Catalyst: $KTaO_3$

Particulate $WO_3$ (plasma $WO_3$) was obtained by performing the inductively coupled plasma treatment disclosed in U.S. Pat. No. 8,003,563.

A 1:1 molar ratio of the photocatalyst plasma $WO_3$ (130 mg) and co-catalyst particulate $KTaO_3$ (150.3 mg) was dispersed in RO water to prepare a dispersion with a solid content of 20 wt %. The dispersion was sonicated first with a bath-type sonicator (the VWR product "B3500A-MT") for 10 min, and then with a probe-type sonicator (sonic dismembrator Model 100, continuous mode) for 5 min to prepare a coating solution.

The coating solution was applied over the whole light-emitting region of the substrate-attached organic EL element using a spin coater, and dried to produce a photocatalyst layer-attached organic EL device in the manner described in Example 1. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

Example 6

Photocatalyst $WO_3$, Co-Catalyst: $SrTiO_3$

A photocatalyst layer-attached organic EL device was obtained in the same manner as in Example 5, except that a coating solution containing the photocatalyst ($WO_3$) and the co-catalyst ($SrTiO_3$) at a molar ratio of 1:1 was prepared using particulate $SrTiO_3$ (102.89 mg) in place of $KTaO_3$. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

Example 7

Photocatalyst $WO_3$, Co-Catalyst: $Ta_2O_5$

A photocatalyst layer-attached organic EL device was produced in the same manner as in Example 1, except that a coating solution containing the photocatalyst ($WO_3$) and the co-catalyst ($Ta_2O_5$) at a molar ratio of 1:1 was prepared using a $Ta_2O_5$ dispersion (130 mg of particulate $Ta_2O_5$ was dispersed in 0.6 g of RO water, and homogenized for 5 min) in place of the $CeO_2$ dispersion. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

Example 8

Photocatalyst $WO_3$, Co-Catalyst: $Nb_2O_5$

A photocatalyst layer-attached organic EL device was produced in the same manner as in Example 1, except that a coating solution containing the photocatalyst ($WO_3$) and the co-catalyst ($Nb_2O_5$) at a molar ratio of 1:1 was prepared using an $Nb_2O_5$ dispersion (130 mg of particulate $Nb_2O_5$ was dispersed in 0.6 g of RO water, and homogenized for 5 min) in place of the $CeO_2$ dispersion. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

Example 9

Photocatalyst $WO_3$, Co-Catalyst: Anatase-Type $TiO_2$

A photocatalyst layer-attached organic EL device was produced in the same manner as in Example 5, except that a coating solution containing the photocatalyst ($WO_3$) and the co-catalyst ($TiO_2$) at a molar ratio of 1:1 was prepared using anatase-type $TiO_2$ (44.78 mg) in place of $KTaO_3$. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

Example 34

Photocatalyst Anatase-Type $TiO_2$, Co-Catalyst: Mixture of $Cu_2O$ and $CuO$

A photocatalyst layer-attached organic EL device was produced in the same manner as in Example 1, except that a $Cu_xO$-supporting $TiO_2$ powder (co-catalyst-supportingtype photocatalyst) was produced in the manner described below, and used in place of the $WO_3$ powder and the $CeO_2$ powder used in Example 1. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

First, 25 g of a $TiO_2$ powder (photocatalyst, average particle size 0.03 μm, Nippon Aerosil Co., Ltd.), and 250 ml of ion-exchange water were added into a 500-ml eggplant flask. The mixture was stirred at room temperature to uniformly disperse the particles, and produce an aqueous dispersion of $TiO_2$ powder.

Thereafter, 0.68 g of copper(II) chloride dihydrate (Wako Pure Chemical Industries, Ltd.) was dissolved in 5 ml of ion-exchange water, and the copper(II) chloride aqueous solution was added to the $TiO_2$ powder aqueous dispersion. The mixture was stirred for 1 h while being heated at 90° C. to produce solution A.

A sodium hydroxide aqueous solution containing 1.255 g of sodium hydroxide dissolved in 25 ml of ion-exchange water was added to solution A, and the solution pH was increased from 3 to 11 to produce solution B.

A glucose aqueous solution containing 6.275 g of glucose (Wako Pure Chemical Industries, Ltd.) in 37.5 ml of ion-exchange water was added to solution B. The mixture was stirred for 1 h while being heated at 90° C., and particles of copper(I) oxide and copper(II) oxide were precipitated on the surface of the titanium oxide particles.

The reacted particles were filtered, thoroughly washed with water, and dried at 100° C. This produced a $Cu_xO$-supporting $TiO_2$ powder (co-catalyst-supporting-type photocatalyst). An ICP analysis of the powder confirmed that a 1.0 weight part of copper oxide particles was supported per 100 weight parts of titanium oxide.

Scanning electron microscopy confirmed that the co-catalyst $Cu_xO$ particles were supported on the photocatalyst $TiO_2$ particles in the photocatalyst layer of the photocatalyst layer-attached organic EL device of Example 34.

Comparative Example 1

Photocatalyst $WO_3$, Co-Catalyst: $Al_2O_3$

A photocatalyst layer-attached organic EL device was produced in the same manner as in Example 1, except that a coating solution with a solid content of 14 wt % was prepared by adding 5.8 g of RO water to a mixture prepared by adding 0.8 g of particulate $WO_3$ to 5 g of an $Al_2O_3$ dispersion (Nissan Chemical Industries, trade name "aluminaso 1200") at a $WO_3$ to $Al_2O_3$ weight ratio of 1:1. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

Comparative Example 2

Photocatalyst $WO_3$, Co-Catalyst: $In_2O_3$

A photocatalyst layer-attached organic EL device was produced in the same manner as in Example 1, except that a coating solution containing the photocatalyst ($WO_3$) and the co-catalyst ($In_2O_3$) at a molar ratio of 1:1 was prepared using an $In_2O_3$ dispersion (130 mg of particulate $In_2O_3$ was dispersed in 0.6 g of RO water, and homogenized for 5 min) in place of the $CeO_2$ dispersion. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

Comparative Example 3

Photocatalyst $WO_3$, Co-Catalyst: SiC

A photocatalyst layer-attached organic EL device was produced in the same manner as in Example 1, except that a coating solution containing the photocatalyst ($WO_3$) and the co-catalyst (SiC) at a molar ratio of 1:1 was prepared using a SiC dispersion (22.5 mg of particulate SiC was dispersed in 0.6 g of RO water, and homogenized for 5 min) in place of the $CeO_2$ dispersion. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

Comparative Example 4

Photocatalyst $WO_3$, Co-Catalyst: $Y_2O_3$

A photocatalyst layer-attached organic EL device was produced in the same manner as in Example 1, except that a coating solution containing the photocatalyst ($WO_3$) and the co-catalyst ($Y_2O_3$) at a molar ratio of 1:1 was prepared using a $Y_2O_3$ dispersion (130 mg of particulate $Y_2O_3$ was dispersed in 0.6 g of RO water, and homogenized for 5 min) in place of the $CeO_2$ dispersion. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

Comparative Example 5

Photocatalyst $WO_3$, Co-Catalyst: CuO

A photocatalyst layer-attached organic EL device was produced in the same manner as in Example 1, except that a coating solution containing the photocatalyst ($WO_3$) and the co-catalyst (CuO) at a molar ratio of 1:1 was prepared using a CuO dispersion (130 mg of particulate CuO was dispersed in 0.6 g of RO water, and homogenized for 5 min) in place of the $CeO_2$ dispersion. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

Comparative Example 6

Photocatalyst $WO_3$, Co-Catalyst: None

A photocatalyst layer-attached organic EL device was produced in the same manner as in Example 1, except that the particulate photocatalyst ($WO_3$) was not mixed with the $CeO_2$ dispersion. The photocatalyst layer had a thickness of 0.2 μm.

Table 1 presents the relative luminance of the photocatalyst layer-attached organic EL device, the acetaldehyde decomposition rate after one hour of photoirradiation, the refractive indices of the photocatalyst and the co-catalyst at 589 nm wavelength, and the refractive index difference between the photocatalyst and the co-catalyst.

h). The photocatalyst layer-attached glass substrate was then placed in a 5-L Tedlar bag in a vacuum, and compressed air (3 L) and acetaldehyde (80 mL) were sealed inside the Tedlar bag. The Tedlar bag was gently kneaded with hands for 2 min, and placed in the dark for 15 min. The acetaldehyde concentration in the Tedlar bag was found to be 80±2 ppm by a GC-FID measurement.

The Tedlar bag containing the photocatalyst layer-attached glass substrate was placed in the dark for 1 h, and irradiated for 5 h with light of a diode array emitting monochromatic blue light (wavelength 455 nm, irradiation intensity 50 mW/cm$^2$). The acetaldehyde concentration in the Tedlar bag was measured every 30 min during the course of photoirradiation, and the percentages of remaining acetaldehyde were calculated over a time course. The result is plotted in the graph shown in FIG. 5.

TABLE 1

| | Photocatalyst | Co-catalyst | Refractive index of photocatalyst (589 nm) | Refractive index of co-catalyst (589 nm) | Refractive index difference between photocatalyst and co-catalyst | Relative luminance (%) | Decomposition rate of acetaldehyde (%) |
|---|---|---|---|---|---|---|---|
| Ex. 1 | $WO_3$ | $CeO_2$ | 2.20 | 2.36 | 0.16 | 86 | 82 |
| Ex. 2 | $WO_3$ | $CeO_2$:Sn (2.5 mol %) | 2.20 | 2.35 | 0.15 | 87 | 98 |
| Ex. 3 | $WO_3$ | $CeO_2$:Sn (5.0 mol %) | 2.20 | 2.34 | 0.14 | 90 | 87 |
| Ex. 4 | $WO_3$ | $CeO_2$:Sn (7.5 mol %) | 2.20 | 2.34 | 0.14 | 90 | 88 |
| Ex. 5 | $WO_3$ | $KTaO_3$ | 2.20 | 2.14 | 0.06 | 92 | 78 |
| Ex. 6 | $WO_3$ | $SrTiO_3$ | 2.20 | 2.37 | 0.17 | 84 | 91 |
| Ex. 7 | $WO_3$ | $Ta_2O_5$ | 2.20 | 2.16 | 0.04 | 92 | 81 |
| Ex. 8 | $WO_3$ | $Nb_2O_5$ | 2.20 | 2.27 | 0.07 | 91 | 75 |
| Ex. 9 | $WO_3$ | Anatase-type $TiO_2$ | 2.20 | 2.52 | 0.32 | 80 | 95 |
| Ex. 34 | $TiO_2$ | $Cu_xO$ (X = 1 to 2) | 2.52 | 2.63 to 2.71 | 0.11 to 0.19 | 83 | 70 |
| Com. Ex. 1 | $WO_3$ | $Al_2O_3$ | 2.20 | 1.76 | 0.44 | 55 | 10 |
| Com. Ex. 2 | $WO_3$ | $In_2O_3$ | 2.20 | 1.74 | 0.46 | 50 | 74 |
| Com. Ex. 3 | $WO_3$ | SiC | 2.20 | 2.63 | 0.43 | 60 | 80 |
| Com. Ex. 4 | $WO_3$ | $Y_2O_3$ | 2.20 | 1.82 | 0.38 | 70 | 11 |
| Com. Ex. 5 | $WO_3$ | CuO | 2.20 | 2.63 | 0.43 | 60 | 10 |
| Com. Ex. 6 | $WO_3$ | None | 2.20 | — | — | 88 | 50 |

Evaluation 1

As can be seen in Table 1, an organic EL device with a relative luminance of 80% or more can be produced when the refractive index difference between the photocatalyst and the co-catalyst is 0 to 0.35.

It can also be seen that the organic EL device shows high photocatalytic activity when $CeO_2$ is used as the co-catalyst. Particularly, an organic EL device with high photocatalytic activity and relative luminance can be produced when a tin (Sn)-doped $CeO_2$ is used as the co-catalyst.

Example 10

Photocatalyst $WO_3$, Co-Catalyst: $CeO_2$

A coating solution containing 200 mg of particulate $WO_3$ (Global Tungsten & Power (GTP)) and particulate $CeO_2$ at a $WO_3$ to $CeO_2$ molar ratio of 1:1 was spin coated on a glass substrate (75 mm length×25 mm width) under the same conditions used in Example 1, and annealed at 400° C. for about 1 h to form a photocatalyst layer. The photocatalyst layer had a thickness of 0.2 μm.

The photocatalyst layer-attached glass substrate was irradiated with light of all wavelengths from a xenon lamp (lamp output of about 300 W) on a hot plate (120° C. for 1

Example 11

Photocatalyst $WO_3$, Co-Catalyst: $CeO_2$ 5 g of $WO_3$ (GTP product) was placed in a high-purity alumina ball mill (the MTI tabletop planetary mill, Model SFM-1) with 25 mL of methanol. The ball mill contained about 50-g $ZrO_2$ balls having a diameter of about 3 mm. The photocatalyst was pulverized for 4 h to obtain particulate $WO_3$.

A photocatalyst layer-attached glass substrate was then produced in the same manner as in Example 10, except that a coating solution containing 200 mg of particulate $WO_3$ and particulate $CeO_2$ at a molar ratio of 1:1 was used. The photocatalyst layer had a thickness of 0.2 μm.

The acetaldehyde concentration in the Tedlar bag was measured under the same conditions used in Example 10, and the percentages of remaining acetaldehyde were calculated over a time course. The results are presented in FIG. 5.

Example 12

Photocatalyst $WO_3$, Co-Catalyst: $CeO_2$

Particulate $WO_3$ (plasma $WO_3$) was obtained by performing the inductively coupled plasma treatment disclosed in U.S. Pat. No. 8,003,563.

A photocatalyst layer-attached glass substrate was produced in the same manner as in Example 10, except that a coating solution containing 200 mg of plasma $WO_3$ and particulate $CeO_2$ at a molar ratio of 1:1 was used. The photocatalyst layer had a thickness of 0.2 μm.

The acetaldehyde concentration in the Tedlar bag was measured under the same conditions used in Example 10, and the percentages of remaining acetaldehyde were calculated over a time course. The results are presented in FIG. 5.

Comparative Example 7

Photocatalyst $WO_3$, Co-Catalyst: None

A photocatalyst layer-attached glass substrate was produced in the same manner as in Example 10, except that a coating solution containing only $WO_3$ (GTP product), without $CeO_2$, was used. The photocatalyst layer had a thickness of 0.2 μm.

The acetaldehyde concentration in the Tedlar bag was measured under the same conditions used in Example 10, and the percentages of remaining acetaldehyde were calculated over a time course. The results are presented in FIG. 5.

Comparative Example 8

Photocatalyst $WO_3$, Co-Catalyst: None

A photocatalyst layer-attached glass substrate was produced in the same manner as in Example 11, except that a coating solution containing only particulate $WO_3$, without $CeO_2$, was used. The photocatalyst layer had a thickness of 0.2 μm.

The acetaldehyde concentration in the Tedlar bag was measured under the same conditions used in Example 10, and the percentages of remaining acetaldehyde were calculated over a time course. The results are presented in FIG. 5.

Comparative Example 9

Photocatalyst $WO_3$, Co-Catalyst: None

A photocatalyst layer-attached glass substrate was produced in the same manner as in Example 12, except that a coating solution containing only plasma $WO_3$, without $CeO_2$, was used. The photocatalyst layer had a thickness of 0.2 μm.

The acetaldehyde concentration in the Tedlar bag was measured under the same conditions used in Example 10, and the percentages of remaining acetaldehyde were calculated over a time course. The results are presented in FIG. 5.

In Examples 10 to 12, the refractive index differences (absolute values) between the photocatalyst and the co-catalyst all fell in a range of 0 to 0.35.

Evaluation 2

Figure 5:
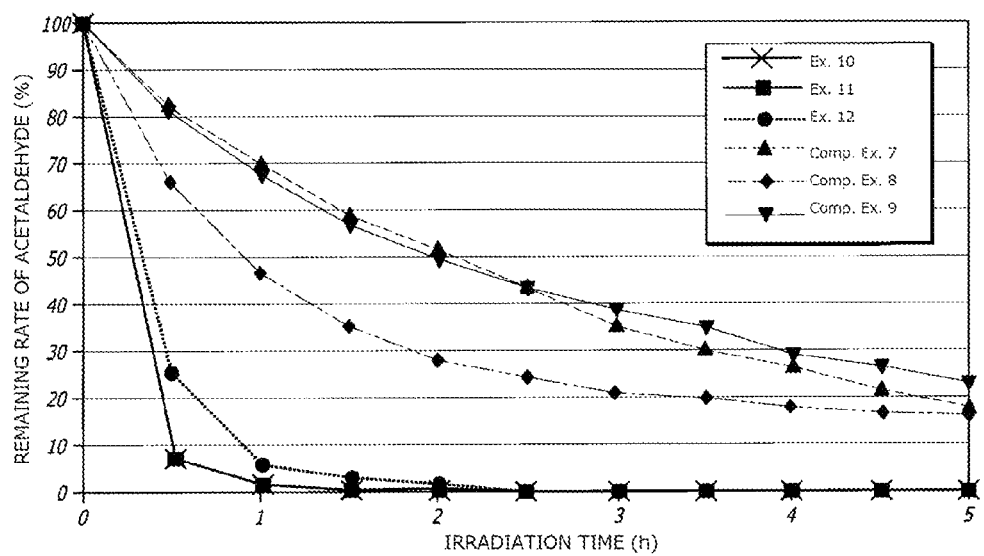
FIG. 5 is a graph representing the percentages of remaining acetaldehyde measured over a time course for the photocatalyst layer-attached glass substrates of Examples 10 to 12, and Comparative Examples 7 to 9.

As can be seen from FIG. 5, the photocatalyst layers that used $WO_3$ as the photocatalyst and $CeO_2$ as the co-catalyst had lower percentages of remaining acetaldehyde (higher photocatalytic activity) than the photocatalyst layers that contained only $WO_3$.

Examples 13 to 19, and Comparative Examples 10 and 11

Photocatalyst layer-attached organic EL devices were produced in the same manner as in Example 1, except that coating solutions containing $CeO_2$ in molar concentrations of 0 mol % (Comparative Example 10), 5 mol % (Example 13), 10 mol % (Example 14), 30 mol % (Example 15), 50 mol % (Example 16), 75 mol % (Example 17), 90 mol % (Example 18), 95 mol % (Example 19), and 100 mol % (Comparative Example 11) with respect to the total number of moles of photocatalyst ($WO_3$) and co-catalyst ($CeO_2$) at 100% were prepared. The photocatalyst layer-attached organic EL devices were each measured for acetaldehyde decomposition rate (after 1 hour from the start of photoirradiation). The Tedlar bag was irradiated with light of a diode array emitting monochromatic blue light (wavelength 455 nm, irradiation intensity 270 mW/cm$^2$).

The acetaldehyde decomposition rates of Examples 13 to 19, and Comparative Examples 10 and 11 were plotted in a graph. The results are shown in FIG. 6.

Evaluation 3

Figure 6:
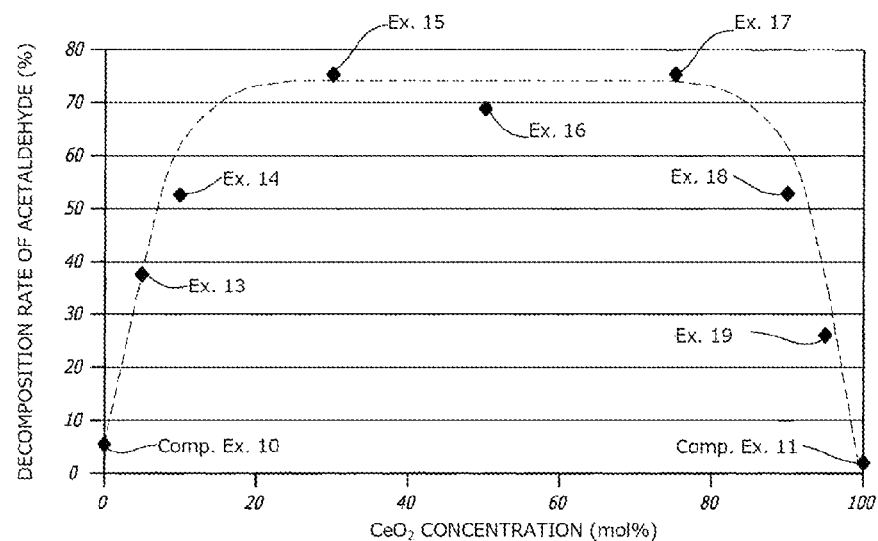
FIG. 6 is a graph representing the acetaldehyde decomposition rates measured for the photocatalyst layer-attached glass substrates of Examples 13 to 19, and Comparative Examples 10 and 11.

As can be seen in FIG. 6, increasing the co-catalyst concentration in the photocatalyst layer increases the photocatalytic activity of the optical compensation layer. However, excessively high co-catalyst concentrations were found to lower the photocatalytic activity of the optical compensation layer. It can be seen that a photocatalyst layer with particularly high photocatalytic activity can be formed with coating solutions containing the co-catalyst in 20 mol % to 80 mol % (the photocatalyst-to-co-catalyst molar ratio of 4:1 to 1:4).

Example 20

Photocatalyst $WO_3$, Co-Catalyst: $CeO_2$

First, 130 mg of plasma $WO_3$ and 96.5 mg of particulate $CeO_2$ were dispersed in RO water in a molar ratio of about 1:1 to prepare a dispersion with a solid content of 20 wt %. The dispersion was then sonicated first with a bath-type sonicator (the VWR product "B3500A-MT") for 10 min, and then with a probe-type sonicator (sonic dismembrator Model 100, continuous mode) for 5 min to prepare a coating solution.

The coating solution was spin coated on a glass substrate (75 mm×50 mm), and annealed under the same conditions used in Example 10 to obtain a photocatalyst layer-attached glass substrate. The photocatalyst layer had a thickness of 0.2 μm.

The acetaldehyde concentration in the Tedlar bag was measured under the same conditions used in Example 10, and the percentages of remaining acetaldehyde were calculated over a time course. The results are presented in FIG. 7.

Example 21

Photocatalyst $WO_3$, Co-Catalyst: Anatase-Type $TiO_2$

A photocatalyst layer-attached glass substrate was obtained in the same manner as in Example 20, except that particulate anatase-type $TiO_2$ (44.78 mg) was used in place of $CeO_2$. The photocatalyst layer had a thickness of 0.2 μm. The acetaldehyde concentration in the Tedlar bag was measured under the same conditions used in Example 10, and the percentages of remaining acetaldehyde were calculated over a time course. The results are presented in FIG. 7.

Example 22

Photocatalyst $WO_3$, Co-Catalyst: $KTaO_3$

A photocatalyst layer-attached glass substrate was obtained in the same manner as in Example 20, except that particulate KTaO$_3$ (150.3 mg) was used in place of CeO$_2$. The photocatalyst layer had a thickness of 0.2 µm.

The acetaldehyde concentration in the Tedlar bag was measured under the same conditions used in Example 10, and the percentages of remaining acetaldehyde were calculated over a time course. The results are presented in FIG. 7.

Example 23

Photocatalyst WO$_3$, Co-Catalyst: SrTiO$_3$

A photocatalyst layer-attached glass substrate was obtained in the same manner as in Example 20, except that particulate SrTiO$_3$ (102.89 mg) was used in place of CeO$_2$. The photocatalyst layer had a thickness of 0.2 µm.

The acetaldehyde concentration in the Tedlar bag was measured under the same conditions used in Example 10, and the percentages of remaining acetaldehyde were calculated over a time course. The results are presented in FIG. 7.

Comparative Example 12

Photocatalyst Plasma WO$_3$, Co-Catalyst: None

A photocatalyst layer-attached glass substrate was obtained in the same manner as in Example 20, except that CeO$_2$ was not used. The photocatalyst layer had a thickness of 0.2 µm.

The acetaldehyde concentration in the Tedlar bag was measured under the same conditions used in Example 10, and the percentages of remaining acetaldehyde were calculated over a time course. The results are presented in FIG. 7.

In Examples 20 to 23, the refractive index differences (absolute values) between the photocatalyst and the co-catalyst all fell in a range of 0 to 0.35.

Evaluation 3

Figure 7:
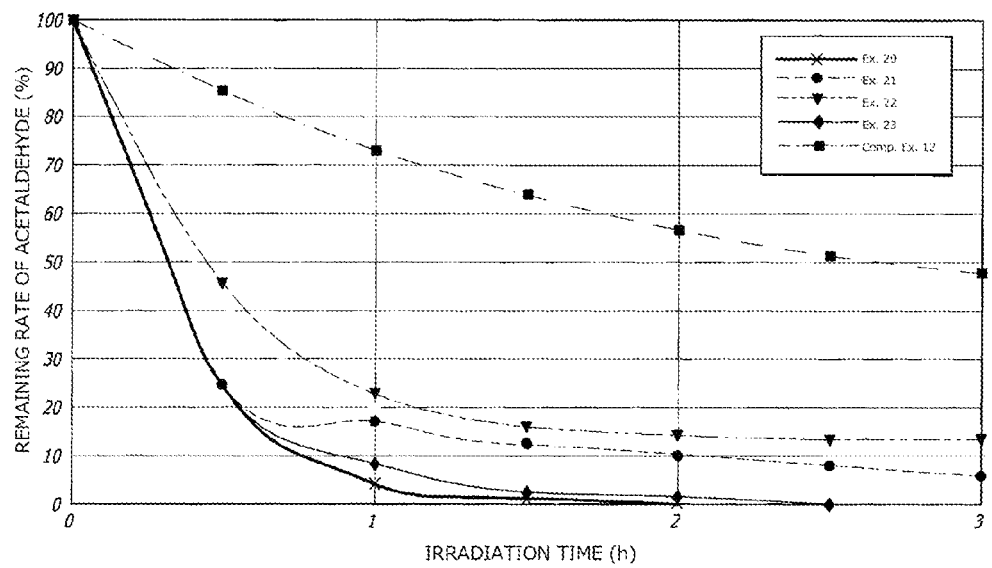
FIG. 7 is a graph representing the percentages of remaining acetaldehyde measured over a time course for the photocatalyst layer-attached glass substrates of Examples 20 to 23, and Comparative Example 12.

As shown in FIG. 7, the photocatalyst layer that used WO$_3$ as the photocatalyst and CeO$_2$ as the co-catalyst had the highest photocatalytic activity 1 hour after the start of photoirradiation. Specifically, organic EL devices with the photocatalyst layer using CeO$_2$ as the co-catalyst can decompose organic contaminants faster than photocatalyst layers using other co-catalysts.

Comparative Example 13

Photocatalyst WO$_3$, Co-Catalyst: CuO

Particulate CuO (130 mg) was dispersed in 0.6 g of RO water, and homogenized for 5 min. The resulting compound was mixed with WO$_3$ at a 1:1 molar ratio as in Example 1 to produce a dispersion. Thereafter, a petri dish surface cleanly wiped with ethanol was ionized with a corona device (1 to 2 min), and the dispersion was poured onto the ionized surface of the petri dish. The dispersion was heated at 120° C. while rotating the petri dish to achieve uniform dispersion, and a photocatalyst layer was formed on the petri dish. The photocatalyst layer had a thickness of 0.2 µm.

Figure 8:
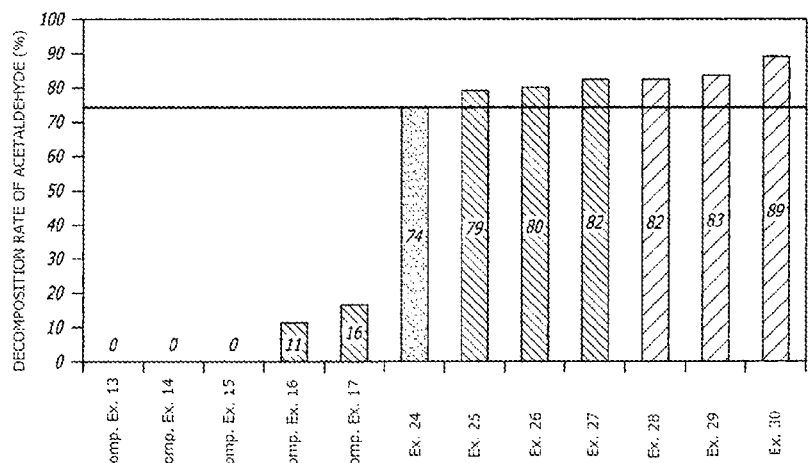
FIG. 8 is a graph representing the acetaldehyde decomposition rates measured for the photocatalyst layer-attached glass substrates of Examples 24 to 30, and Comparative Examples 13 to 17.

The petri dish with the photocatalyst layer was irradiated using a xenon lamp in the same manner as in Example 10, and was placed in a Tedlar bag. The acetaldehyde concentration was then measured after 5 hours from the start of photoirradiation, and the decomposition rate of acetaldehyde was calculated. The results are shown in FIG. 8.

Comparative Example 14

Photocatalyst WO$_3$, Co-Catalyst: MoO$_3$

A photocatalyst layer was formed on a petri dish in the same manner as in Comparative Example 13, except that particulate MoO$_3$ (130 mg) was used in place of CuO. The acetaldehyde concentration was measured, and the decomposition rate of acetaldehyde was calculated. The results are shown in FIG. 8. The photocatalyst layer had a thickness of 0.2 µm.

Comparative Example 15

Photocatalyst WO$_3$, Co-Catalyst: Mn$_2$O$_3$

A photocatalyst layer was formed on a petri dish in the same manner as in Comparative Example 13, except that particulate Mn$_2$O$_3$ (130 mg) was used in place of CuO. The acetaldehyde concentration was measured, and the decomposition rate of acetaldehyde was calculated. The results are shown in FIG. 8. The photocatalyst layer had a thickness of 0.2 µm.

Comparative Example 16

Photocatalyst WO$_3$, Co-Catalyst: Y$_2$O$_3$

A photocatalyst layer was formed on a petri dish in the same manner as in Comparative Example 13, except that particulate Y$_2$O$_3$ (130 mg) was used in place of CuO. The acetaldehyde concentration was measured, and the decomposition rate of acetaldehyde was calculated. The results are shown in FIG. 8. The photocatalyst layer had a thickness of 0.2 µm.

Comparative Example 17

Photocatalyst WO$_3$, Co-Catalyst: Gd$_2$O$_3$

A photocatalyst layer was formed on a petri dish in the same manner as in Comparative Example 13, except that particulate Gd$_2$O$_3$ (130 mg) was used in place of CuO. The acetaldehyde concentration was measured, and the decomposition rate of acetaldehyde was calculated. The results are shown in FIG. 8. The photocatalyst layer had a thickness of 0.2 µm.

Example 24

Photocatalyst WO$_3$, Co-Catalyst: Nb$_2$O$_5$

A photocatalyst layer was formed on a petri dish in the same manner as in Comparative Example 13, except that particulate Nb$_2$O$_5$ (130 mg) was used in place of CuO. The acetaldehyde concentration was measured, and the decomposition rate of acetaldehyde was calculated. The results are shown in FIG. 8. The photocatalyst layer had a thickness of 0.2 µm.

Example 25

Photocatalyst WO$_3$, Co-Catalyst: Ta$_2$O$_5$

A photocatalyst layer was formed on a petri dish in the same manner as in Comparative Example 13, except that particulate $Ta_2O_5$ (130 mg) was used in place of CuO. The acetaldehyde concentration was measured, and the decomposition rate of acetaldehyde was calculated. The results are shown in FIG. 8. The photocatalyst layer had a thickness of 0.2 μm.

Example 26

Photocatalyst $WO_3$, Co-Catalyst: Mixture of Rutile-Type and Anatase-Type $TiO_2$ A photocatalyst layer was formed on a petri dish in the same manner as in Comparative Example 13, except that a mixture (130 mg) of particulate rutile-type $TiO_2$ and particulate anatase-type $TiO_2$ was used in place of CuO. The acetaldehyde concentration was measured, and the decomposition rate of acetaldehyde was calculated. The results are shown in FIG. 8. The photocatalyst layer had a thickness of 0.2 μm.

Example 27

Photocatalyst $WO_3$, Co-Catalyst: $CeO_2$

A photocatalyst layer was formed on a petri dish in the same manner as in Comparative Example 13, except that $CeO_2$ (Nippon Chemical Industrial Co., Ltd.; 130 mg) was used in place of CuO. The acetaldehyde concentration was measured, and the decomposition rate of acetaldehyde was calculated. The results are shown in FIG. 8. The photocatalyst layer had a thickness of 0.2 μm.

Example 28

Photocatalyst $WO_3$, Co-Catalyst: $CeO_2$

A photocatalyst layer was formed on a petri dish in the same manner as in Comparative Example 13, except that particulate $CeO_2$ (Sigma Aldrich; 130 mg) was used in place of CuO. The acetaldehyde concentration was measured, and the decomposition rate of acetaldehyde was calculated. The results are shown in FIG. 8. The photocatalyst layer had a thickness of 0.2 μm.

Example 29

Photocatalyst $WO_3$, Co-Catalyst: $CeO_2$

A photocatalyst layer was formed on a petri dish in the same manner as in Comparative Example 13, except that plasma synthesized particulate $CeO_2$ (plasma $CeO_2$; 130 mg) was used in place of CuO. The acetaldehyde concentration was measured, and the decomposition rate of acetaldehyde was calculated. The results are shown in FIG. 8. The photocatalyst layer had a thickness of 0.2 μm.

Example 30

Photocatalyst $WO_3$, Co-Catalyst: Anatase-Type $TiO_2$

A photocatalyst layer was formed on a petri dish in the same manner as in Comparative Example 13, except that particulate anatase-type $TiO_2$; 130 mg) was used in place of CuO. The acetaldehyde concentration was measured, and the decomposition rate of acetaldehyde was calculated. The results are shown in FIG. 8. The photocatalyst layer had a thickness of 0.2 μm.

In Examples 24 to 30, the refractive index differences (absolute values) between the photocatalyst and the co-catalyst all fell in a range of 0 to 0.35.

Example 31

Photocatalyst $WO_3$, Co-Catalyst: $CeO_2$:Sn (7.5 mol %)

The coating solution produced in Example 4 was applied on a glass substrate (75 mm length×50 mm width) using a spin coater at a rotation speed of 1200 rpm for 40 s. The glass substrate with the laminated coating solution was heated at 120° C. for 2 min to produce a photocatalyst layer-attached glass substrate. The $CeO_2$ contained in the photocatalyst layer contained 7.5 mol % of tin (Sn) within the molecule.

Figure 9:
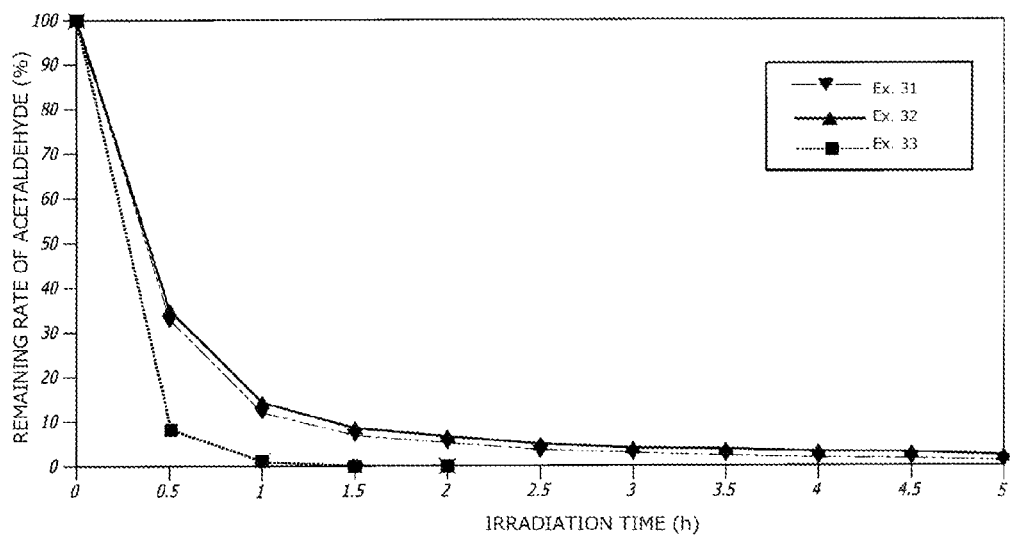
FIG. 9 is a graph representing the percentages of remaining acetaldehyde measured over a time course for the photocatalyst layer-attached glass substrates of Examples 31 to 33.

The photocatalyst layer-attached glass substrate was measured for acetaldehyde concentration under the same conditions used in Example 10, and changes in acetaldehyde decomposition rate in the Tedlar bag were plotted over a time course in a graph. The results are shown in FIG. 9. The photocatalyst layer had a thickness of 0.2 μm.

Example 32

Photocatalyst $WO_3$, Co-Catalyst: $CeO_2$:Sn (5.0 mol %)

A photocatalyst layer-attached glass substrate was produced in the same manner as in Example 31, except that the coating solution produced in Example 3 was used. The $CeO_2$ contained in the photocatalyst layer contained 5 mol % of tin (Sn) within the molecule.

The photocatalyst layer-attached glass substrate was measured for acetaldehyde concentration under the same conditions used in Example 10, and changes in acetaldehyde decomposition rate in the Tedlar bag were plotted over a time course in a graph. The results are shown in FIG. 9. The photocatalyst layer had a thickness of 0.2 μm.

Example 33

Photocatalyst $WO_3$, Co-Catalyst: $CeO_2$:Sn (2.5 mol %)

A photocatalyst layer-attached glass substrate was produced in the same manner as in Example 31, except that the coating solution produced in Example 2 was used. The $CeO_2$ contained in the photocatalyst layer contained 2.5 mol % of tin (Sn) within the molecule.

The photocatalyst layer-attached glass substrate was measured for acetaldehyde concentration under the same conditions used in Example 10, and changes in acetaldehyde decomposition rate in the Tedlar bag were plotted over a time course in a graph. The results are shown in FIG. 9. The photocatalyst layer had a thickness of 0.2 μm.

Evaluation 4

As can be seen in FIG. 9, the photocatalyst layers that used tin (Sn)-doped $CeO_2$ as the co-catalyst had notably high photocatalytic activity. Particularly, most of the acetaldehyde (90% or more) can be decomposed in 0.5 hours of photoirradiation when the co-catalyst contains 2.5 mol % of tin (Sn) within the molecule.

While the present invention has been described in detail by way of certain embodiments, it will be understood by a skilled person that various changes and modifications may be made thereto within the spirit and scope of the invention.

This application is based on Japanese Patent Application (2013-143584) filed Jul. 9, 2013, the entire contents of which are hereby incorporated by reference. Industrial Applicability The organic EL device of the present invention has applications in, for example, room illumination, and lighting in refrigerators.

REFERENCE SIGNS LIST

1: Organic EL device
2: Substrate
3: Organic EL element
31: First conductive layer
32: Organic EL layer
33: Second conductive layer
34: Light-emitting region
35: Insulating layer
4: Photocatalyst layer
41: Photocatalyst
42: Co-catalyst

The invention claimed is:

1. An organic electroluminescent device comprising:
a substrate;
an organic electroluminescent element; and
a photocatalyst layer;
wherein the organic electroluminescent element includes:
a first conductive layer provided on the substrate,
an organic electroluminescent layer disposed on the first conductive layer, and
a second conductive layer disposed on the organic electroluminescent layer;
wherein the photocatalyst layer covers at least part of a light-emitting region of the organic electroluminescent element and contains a photocatalyst and a co-catalyst; and
wherein an absolute value of the difference ($|R1-R2|$) between the refractive index (R1) of the photocatalyst and the refractive index (R2) of the co-catalyst at a wavelength of 589 nm has a value in a range from 0 to 0.35.

2. The organic electroluminescent device according to claim 1, wherein the photocatalyst layer exhibits photocatalytic activity when exposed to visible light.

3. The organic electroluminescent device according to claim 1, wherein the photocatalyst contains tungsten oxide, and the co-catalyst contains cerium oxide.

4. The organic electroluminescent device according to claim 3, wherein the tungsten oxide is tungsten(VI) oxide, and the cerium oxide is cerium(IV) oxide.

5. The organic electroluminescent device according to claim 3, wherein the cerium oxide is a doped-type co-catalyst doped with tin (Sn) within the molecule.

6. The organic electroluminescent device according to claim 1, wherein the photocatalyst contains titanium(IV) oxide, and wherein the co-catalyst contains copper(I) oxide or copper(II) oxide and is supported on the photocatalyst.

7. The organic electroluminescent device according to claim 1, wherein the photocatalyst layer is disposed on the organic electroluminescent element, and wherein the organic electroluminescent element is top-emission type.

8. The organic electroluminescent device according to claim 1, wherein the organic electroluminescent element further includes a translucent insulating layer on the second conductive layer, and the photocatalyst layer is provided on the insulating layer.

9. A refrigerator comprising the organic electroluminescent device of claim 1.

* * * * *